US008035789B2

(12) United States Patent
Yamada

(10) Patent No.: US 8,035,789 B2
(45) Date of Patent: Oct. 11, 2011

(54) MOUNTING STRUCTURE, ELECTRO-OPTICAL DEVICE, INPUT DEVICE, METHOD OF MANUFACTURING MOUNTING STRUCTURE, AND ELECTRONIC APPARATUS

(75) Inventor: Kazuyuki Yamada, Matsumoto (JP)

(73) Assignee: Sony Corporation, Tokyo (JP)

( * ) Notice: Subject to any disclaimer, the term of this patent is extended or adjusted under 35 U.S.C. 154(b) by 292 days.

(21) Appl. No.: 12/028,384

(22) Filed: Feb. 8, 2008

(65) Prior Publication Data

US 2008/0232047 A1    Sep. 25, 2008

(30) Foreign Application Priority Data

Mar. 19, 2007  (JP) ................................ 2007-070210
Nov. 20, 2007  (JP) ................................ 2007-300177

(51) Int. Cl.
*G02F 1/1345* (2006.01)
*G02F 1/1333* (2006.01)
(52) U.S. Cl. ........................................ 349/150; 349/110
(58) Field of Classification Search .................. 349/110, 349/150
See application file for complete search history.

(56) References Cited

U.S. PATENT DOCUMENTS

| | | | | |
|---|---|---|---|---|
| 4,735,847 A * | 4/1988 | Fujiwara et al. | ............... | 428/209 |
| 6,703,702 B2 * | 3/2004 | Inoue et al. | .................. | 257/684 |
| 6,734,941 B2 * | 5/2004 | Yamazaki et al. | ............ | 349/150 |
| 6,836,310 B2 * | 12/2004 | Yamazaki et al. | ............ | 349/150 |
| 7,349,054 B2 * | 3/2008 | Kohtaka | ........................ | 349/150 |
| 7,349,620 B2 * | 3/2008 | Shinojima | ..................... | 385/147 |
| 2002/0180686 A1 * | 12/2002 | Yuda et al. | .................... | 345/103 |
| 2003/0020152 A1 * | 1/2003 | Inoue et al. | .................. | 257/684 |
| 2003/0086049 A1 * | 5/2003 | Yamazaki et al. | ............ | 349/149 |
| 2003/0095227 A1 * | 5/2003 | Kohtaka | ........................ | 349/151 |
| 2004/0109665 A1 * | 6/2004 | Shinojima | ..................... | 385/146 |
| 2004/0174487 A1 * | 9/2004 | Yamazaki et al. | ............ | 349/150 |
| 2005/0202694 A1 * | 9/2005 | Yumoto et al. | ................. | 439/67 |
| 2005/0230818 A1 * | 10/2005 | Ohno et al. | .................... | 257/707 |
| 2008/0143948 A1 * | 6/2008 | Kohtaka | ........................ | 349/150 |

FOREIGN PATENT DOCUMENTS

| | | |
|---|---|---|
| JP | 08-022017 | 1/1996 |
| JP | 2003-295215 | 10/2003 |
| JP | 2004-087940 | 3/2004 |

* cited by examiner

*Primary Examiner* — K. Cyrus Kianni

(74) *Attorney, Agent, or Firm* — K&L Gates LLP

(57) ABSTRACT

A mounting structure includes a substrate, a first terminal, a first flexible circuit board, and a second terminal. The first terminal is arranged in a first region of a first face of the substrate. The first flexible circuit board is connected to the first terminal through an anisotropic conductive film. The second terminal is arranged in a second region of a second face, which is a rear face relative to the first face of the substrate, wherein the second region does not overlap the first region in plan view. A region of the second face of the substrate, which overlaps the first region in plan view, is formed to be a smooth face.

7 Claims, 18 Drawing Sheets

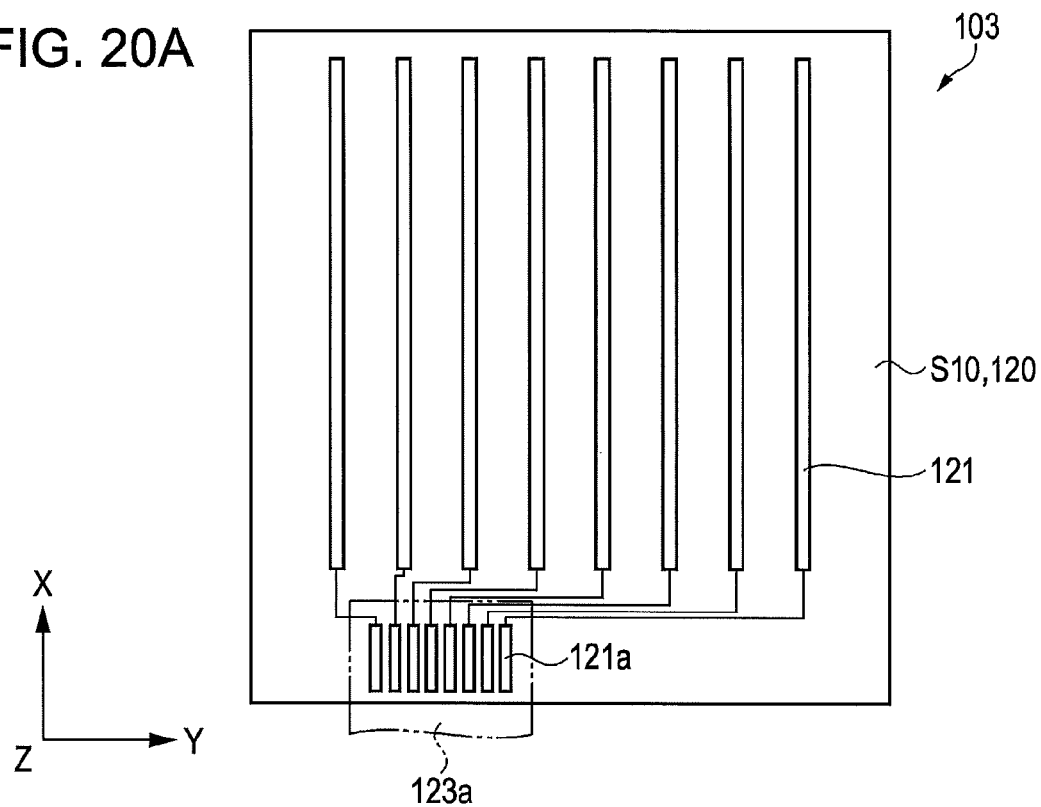
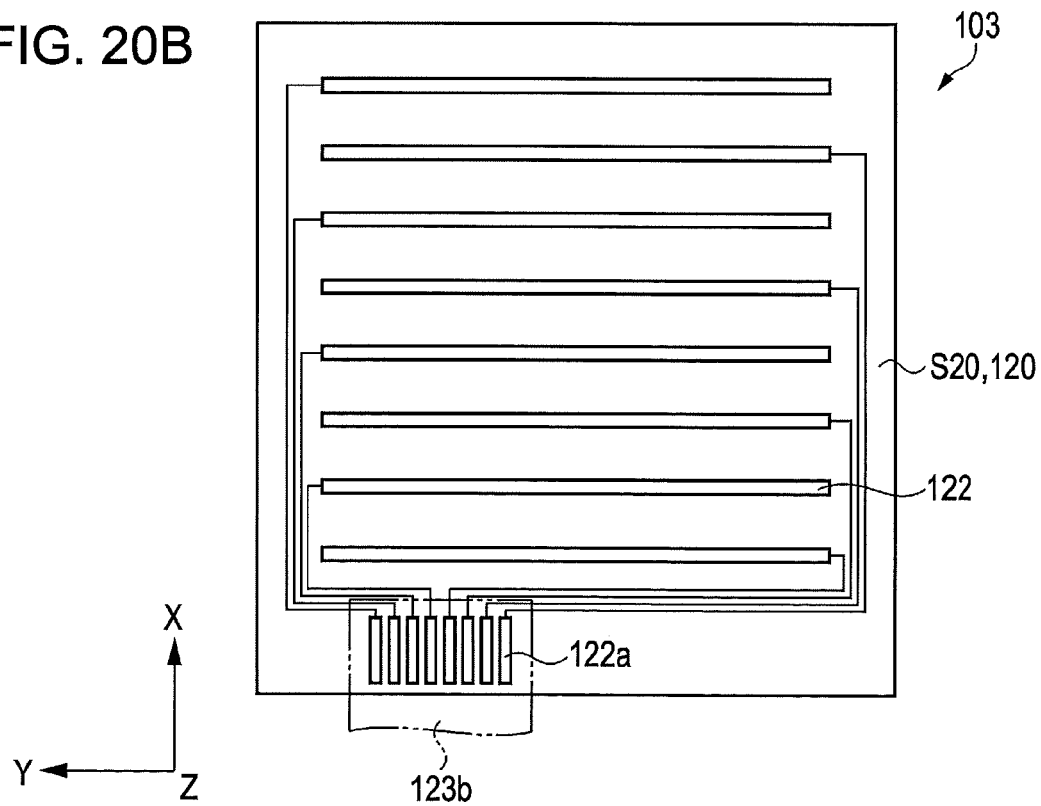

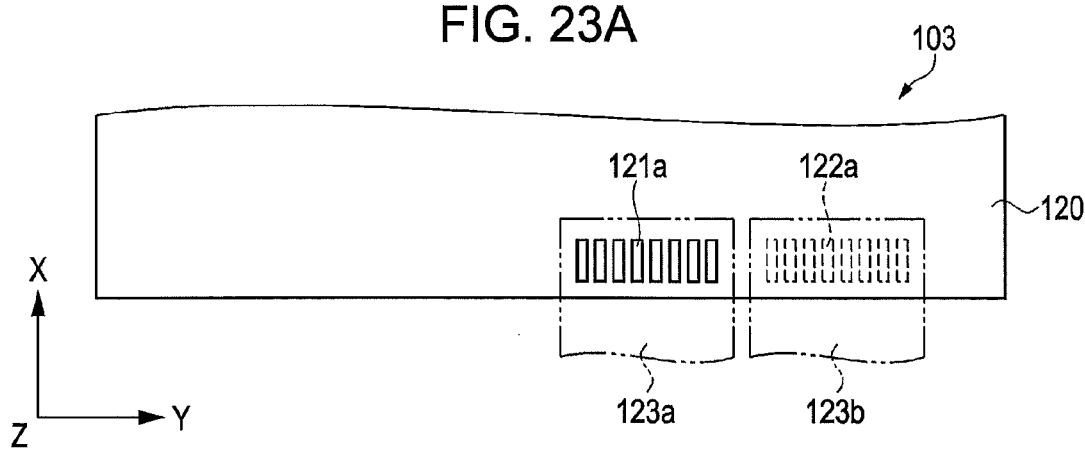
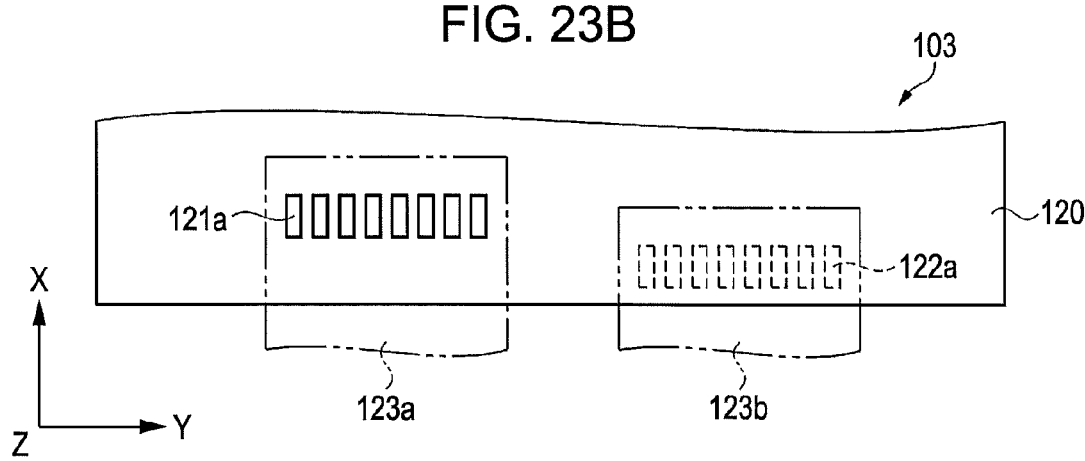
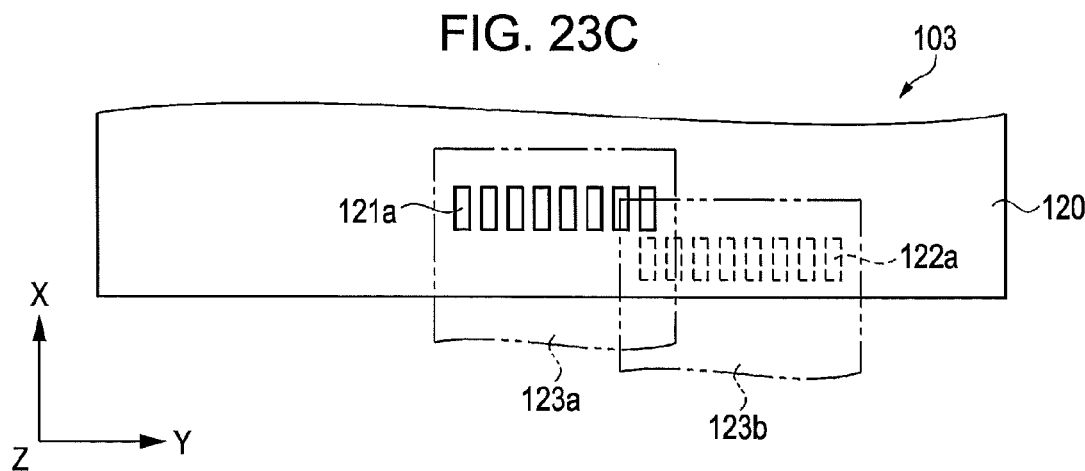

MOUNTING STRUCTURE, ELECTRO-OPTICAL DEVICE, INPUT DEVICE, METHOD OF MANUFACTURING MOUNTING STRUCTURE, AND ELECTRONIC APPARATUS

The entire disclosure of Japanese Patent Application Nos. 2007-070210, filed Mar. 19, 2007 and 2007-300177, filed Nov. 20, 2007 are expressly incorporated by reference herein.

BACKGROUND

1. Technical Field

The present invention relates to an electronic apparatus, such as a personal computer, a cellular phone or a touch panel, and also to a mounting structure, an electro-optical device and an input device that are used for the above electronic apparatus, and further to a method of manufacturing the mounting structure.

2. Related Art

In an existing art, an electro-optical device, such as a liquid crystal device, is used as a display device of an electronic apparatus, such as a personal computer, a cellular phone or a touch panel. The above liquid crystal device, or the like, for example, is configured so that a liquid crystal panel that holds a liquid crystal is compression bonded with a flexible printed board on which an IC chip is mounted and, in addition, the flexible printed board is compression bonded with a printed board. The flexible printed board may possibly have terminals formed on a face (front face or first face) of a portion, which is compression bonded with the printed board, on a side adjacent to the printed board and a rear face (second face) of the compression bonded portion. In this case, for example, when the flexible printed board is thermally compression bonded with the printed board, the thermocompression bonding cannot be performed uniformly because of the terminals formed on the rear face side of the flexible printed board. For this reason, there has been a problem in which reliability of connection between the terminals formed on the front face side of the flexible printed board and the terminals of the printed board decreases.

In order to solve the above problem, JP-A-2004-87940 (particularly, at paragraph [0052], FIG. 2 and FIG. 4), for example, describes a technology for improving an electrical connection in such a manner that a front face, on which a thermocompression bonding head of a compression bonding jig used for thermocompression bonding contacts a printed board, that is, a non-bonded side of a thermally compression bonded region, is formed to be flat.

However, in the above described technology, for example, it is possible to improve reliability of connection between the terminals formed on the front face (first face) of the flexible printed board and the terminals formed on the printed board, but it is necessary to ensure flatness of the printed board. Thus, there is, for example, a problem in which an additional board cannot be connected to the front face side of the printed board. In addition, there is another problem in which, when another board is connected to the rear face (second face) of the flexible printed board as well, thermocompression bonding cannot be performed uniformly because of the terminals formed on the front face of the flexible printed board, resulting in a decrease in reliability of connection.

SUMMARY

An advantage of some aspects of the invention is that it provides a mounting structure, an electro-optical device, an input device and a method of manufacturing the mounting structure, which are able to improve reliability of connection between a substrate and a circuit board on both front and rear faces of the substrate, and also provides an electronic apparatus provided with the mounting structure.

FIRST APPLICATION EXAMPLE

An aspect of this application example provides a mounting structure. The mounting structure includes a substrate, a first terminal, a first flexible circuit board, and a second terminal. The first terminal is arranged in a first region of a first face of the substrate. The first flexible circuit board is connected to the first terminal through an anisotropic conductive film. The second terminal is arranged in a second region of a second face, which is a rear face relative to the first face of the substrate, wherein the second region does not overlap the first region in plan view. A region of the second face of the substrate, which overlaps the first region in plan view, is formed to be a smooth face.

According to the above aspect, when the first terminal and the first flexible circuit board are compression bonded and connected, the second terminal is not placed in between a compression bonding jig, so that it is possible to perform compression bonding using the smooth face by, for example, a compression bonding member of the compression bonding jig. Thus, it is possible to press the substrate and the first flexible circuit board with a uniform force, and it is possible to improve reliability of connection, on the first face side of the substrate, between the first terminal and the first flexible circuit board. In addition, after the above process, when the second terminal and, for example, the second flexible circuit board are compression bonded and connected, the first terminal and the first flexible circuit board are not placed in between the compression bonding jig. Thus, even when the substrate and the first flexible circuit board have been already compression bonded, it is possible to press the substrate and the second flexible circuit board with a uniform force, so that it is possible to improve reliability of connection, on the second face of the substrate, between the second terminal and the second flexible circuit board.

SECOND APPLICATION EXAMPLE

The mounting structure according to the above aspect of the application example may be configured so that the second terminal is arranged in a region of the second face of the substrate, which does not overlap a region opposite the first flexible circuit board.

According to the above aspect, because the first terminal that is arranged on the first face of the substrate, the first flexible circuit board that is connected to the first terminal through the anisotropic conductive film, and the second terminal that is arranged in the region of the second face of the substrate, which does not overlap the region opposite the first flexible circuit board are provided, and the region of the second face of the substrate, which overlaps the first flexible circuit board in plan view, is formed to be the smooth face, when the first terminal and the first flexible circuit board are, for example, compression bonded and connected, it is possible to perform compression bonding using the smooth face by, for example, the compression bonding member of the compression bonding jig while the second terminal is not placed in between the compression bonding jig. Thus, it is possible to press the substrate and the first flexible circuit board with a uniform force, and it is possible to improve reliability of connection, on the first face side of the substrate, between the first terminal and the first flexible circuit board. In addition, after the above process, when the second terminal and, for example, the second flexible circuit board are compression bonded and connected, the first terminal and the first flexible circuit board are not placed in between the compression bonding jig. Thus, even when the substrate and the first flexible circuit board have been already compression bonded, it is possible to press the substrate and the second flexible circuit board with a uniform force, so that it is possible to improve reliability of connection, on the second face of the substrate, between the second terminal and the second flexible circuit board.

THIRD APPLICATION EXAMPLE

In the mounting structure according to the above application example, a region of the first face of the substrate, which overlaps the second region in plan view, may be formed to be a smooth face. Thus, because the region of the first face of the substrate, which overlaps the second region in plan view, is formed to be the smooth face, it is possible to press the substrate and the second flexible circuit board with a uniform force, so that it is possible to improve reliability of connection, on the second face side of the substrate, between the second terminal and the second flexible circuit board.

In the mounting structure according to the above application example, a second flexible circuit board that is arranged in a region of the second face of the substrate, which does not overlap the region opposite the first flexible circuit board, may be connected to the second terminal through the anisotropic conductive film. In this manner, when the second terminal and, for example, the second flexible circuit board are compression bonded and connected, the first terminal and the first flexible circuit board are not placed in between the compression bonding jig. Thus, even when the substrate and the first flexible circuit board have been already compression bonded, it is possible to press the substrate and the second flexible circuit board with a uniform force, so that it is possible to improve reliability of connection, on the second face of the substrate, between the second terminal and the second flexible circuit board.

FOURTH APPLICATION EXAMPLE

In the mounting structure according to the above application example, one of the first flexible circuit board and a second flexible circuit board may be connected to the second terminal in the second region through the anisotropic conductive film. According to the above aspect, when the second terminal and, for example, the first flexible circuit board are compression bonded and connected, the first terminal and the first flexible circuit board are not placed in between the compression bonding jig. In addition, when the first terminal and, for example, the first flexible circuit board are compression bonded and connected, the second terminal and the first flexible circuit board are not placed in between the compression bonding jig. Thus, even when the substrate and the first flexible circuit board have been already compression bonded, it is possible to press the second terminal, which is arranged in the second region of the second face of the substrate, and the first flexible circuit board with a uniform force. Thus, it is possible to improve reliability of connection between the second terminal, which is arranged in the second region of the second face of the substrate, and the first flexible circuit board.

In the mounting structure according to the above application example, a second flexible circuit board that is connected to the second terminal in the second region through the anisotropic conductive film may be provided. According to the above aspect, when the second terminal and, for example, the second flexible circuit board are compression bonded and connected, the first terminal and the first flexible circuit board are not placed in between the compression bonding jig. Thus, even when the substrate and the first flexible circuit board have been already compression bonded, it is possible to press the substrate and the second flexible circuit board with a uniform force, so that it is possible to improve reliability of connection, on the second face of the substrate, between the second terminal and the second flexible circuit board.

FIFTH APPLICATION EXAMPLE

In the mounting structure according to the above application example, the smooth face of the substrate may be formed so that the first face of the substrate is exposed. Thus, because the smooth face of the substrate is formed so that the first face of the substrate is exposed, it is possible to further improve reliability of connection between the first terminal and the first flexible circuit board. In addition, it is possible to improve reliability of connection between the second terminal and the second flexible circuit board.

SIXTH APPLICATION EXAMPLE

An aspect of this application example provides an electro-optical device. The electro-optical device includes a substrate, a display portion, a first terminal, a first flexible circuit board, and a second terminal. The display portion is formed on the substrate. The first terminal is electrically connected to the display portion and arranged in a first region of a first face of the substrate. The first flexible circuit board is connected to the first terminal through an anisotropic conductive film. The second terminal is arranged in a second region of a second face, which is a rear face relative to the first face of the substrate, wherein the second region does not overlap the first region in plan view. A region of the second face of the substrate, which overlaps the first region in plan view, is formed to be a smooth face.

According to the above aspect, when the first terminal and the first flexible circuit board are compression bonded and connected, the second terminal is not placed in between a compression bonding jig, so that it is possible to perform compression bonding using the smooth face by, for example, a compression bonding member of the compression bonding jig. Thus, it is possible to press the substrate and the first flexible circuit board with a uniform force, and it is possible to improve reliability of connection, on the first face side of the substrate, between the first terminal and the first flexible circuit board. In addition, after the above, when the second terminal and, for example, the second flexible circuit board are compression bonded and connected, the first terminal is not placed in between the compression bonding jig. Thus, even when the substrate and the first flexible circuit board have been already compression bonded, it is possible to press the substrate and the second flexible circuit board with a uniform force, so that it is possible to improve reliability of connection, on the second face of the substrate, between the second terminal and the second flexible circuit board.

In the electro-optical device according to the above application example, a second flexible circuit board that is arranged in a region of the second face of the substrate, which does not overlap the region opposite the first flexible circuit board, may be connected to the second terminal through the anisotropic conductive film.

SEVENTH APPLICATION EXAMPLE

The electro-optical device according to the above aspect of the application example may be configured so that the second terminal is arranged in a region of the second face of the substrate, which does not overlap a region opposite the first flexible circuit board. In this manner, when the second terminal and, for example, the second flexible circuit board are compression bonded and connected, the first terminal and the first flexible circuit board are not placed in between the compression bonding jig. Thus, even when the substrate and the first flexible circuit board have been already compression bonded, it is possible to press the substrate and the second flexible circuit board with a uniform force, so that it is possible to improve reliability of connection, on the second face of the substrate, between the second terminal and the second flexible circuit board.

In the electro-optical device according to the above application example, the first terminal that is arranged on the first face of the substrate, the first flexible circuit board that is connected to the first terminal through the anisotropic conductive film, and the second terminal that is arranged in a region of the second face of the substrate, which does not overlap a region opposite the first flexible circuit board may be provided, wherein a region of the second face of the substrate, which overlaps the first flexible circuit board in plan view, may be formed to be a smooth face. According to the above aspect, because the first terminal that is arranged on the first face of the substrate, the first flexible circuit board that is connected to the first terminal through the anisotropic conductive film, and the second terminal that is arranged in the region of the second face of the substrate, which does not overlap the region opposite the first flexible circuit board are provided, and the region of the second face of the substrate, which overlaps the first flexible circuit board in plan view, is formed to be the smooth face, when the first terminal and the first flexible circuit board are, for example, compression bonded and connected, it is possible to perform compression bonding using the smooth face by, for example, the compression bonding member of the compression bonding jig while the second terminal is not placed in between the compression bonding jig. Thus, it is possible to press the substrate and the first flexible circuit board with a uniform force, and it is possible to improve reliability of connection, on the first face side of the substrate, between the first terminal and the first flexible circuit board. In addition, after the above process, when the second terminal and, for example, the second flexible circuit board are compression bonded and connected, the first terminal is not placed in between the compression bonding jig. Thus, even when the substrate and the first flexible circuit board have been already compression bonded, it is possible to press the substrate and the second flexible circuit board with a uniform force, so that it is possible to obtain the electro-optical device that improves reliability of connection, on the second face of the substrate, between the second terminal and the second flexible circuit board.

EIGHTH APPLICATION EXAMPLE

In the electro-optical device according to the above application example, a region of the first face of the substrate, which overlaps the second region in plan view, may be formed to be a smooth face. Thus, because the region of the first face of the substrate, which overlaps the second region in plan view, is formed to be the smooth face, it is possible to press the substrate and the second flexible circuit board with a uniform force, so that it is possible to improve reliability of connection, on the second face side of the substrate, between the second terminal and the second flexible circuit board.

In the electro-optical device according to the above application example, the first flexible circuit board may be connected to the second terminal in the second region through the anisotropic conductive film.

NINTH APPLICATION EXAMPLE

In the electro-optical device according to the above application example, one of the first flexible circuit board and a second flexible circuit board may be connected to the second terminal in the second region through the anisotropic conductive film. According to the above aspect, when the second terminal and, for example, the first flexible circuit board are compression bonded and connected, the first terminal and the first flexible circuit board are not placed in between the compression bonding jig. In addition, when the first terminal and, for example, the first flexible circuit board are compression bonded and connected, the second terminal and the first flexible circuit board are not placed in between the compression bonding jig. Thus, even when the substrate and the first flexible circuit board have been already compression bonded, it is possible to press the second terminal, which is arranged in the second region of the second face of the substrate, and the first flexible circuit board with a uniform force. Thus, it is possible to improve reliability of connection between the second terminal, which is arranged in the second region of the second face of the substrate, and the first flexible circuit board.

In the electro-optical device according to the above application example, a second flexible circuit board that is connected to the second terminal in the second region through the anisotropic conductive film may be provided. According to the above aspect, when the second terminal and, for example, the second flexible circuit board are compression bonded and connected, the first terminal and the first flexible circuit board are not placed in between the compression bonding jig. Thus, even when the substrate and the first flexible circuit board have been already compression bonded, it is possible to press the substrate and the second flexible circuit board with a uniform force, so that it is possible to improve reliability of connection, on the second face of the substrate, between the second terminal and the second flexible circuit board.

TENTH APPLICATION EXAMPLE

In the electro-optical device according to the above application example, the second terminal may be electrically connected to an electrode that is formed on the second face of the substrate. Thus, it is possible to connect the second flexible circuit board through the second terminal to the electrode that is formed on the second face, and it is possible to improve reliability of the connection.

ELEVENTH APPLICATION EXAMPLE

An aspect of this application example provides an input device. The input device includes a substrate, a display input portion, a first terminal, a first flexible circuit board, and a second terminal. The display input portion is formed on the substrate. The first terminal is electrically connected to the display input portion and arranged in a first region of a first face of the substrate. The first flexible circuit board is connected to the first terminal through an anisotropic conductive film. The second terminal is arranged in a second region of a second face, which is a rear face relative to the first face of the substrate, wherein the second region does not overlap the first region in plan view. A region of the second face of the substrate, which overlaps the first region in plan view, is formed to be a smooth face. According to the above aspect, when the first terminal and the first flexible circuit board are compression bonded and connected, the second terminal is not placed in between a compression bonding jig, so that it is possible to perform compression bonding using the smooth face by, for example, a compression bonding member of the compression bonding jig. Thus, it is possible to press the substrate and the first flexible circuit board with a uniform force, and it is possible to improve reliability of connection, on the first face side of the substrate, between the first terminal and the first flexible circuit board. In addition, after the above, when the second terminal and, for example, the second flexible circuit board are compression bonded and connected, the first terminal is not placed in between the compression bonding jig. Thus, even when the substrate and the first flexible circuit board have been already compression bonded, it is possible to press the substrate and the second flexible circuit board with a uniform force, so that it is possible to improve reliability of connection, on the second face of the substrate, between the second terminal and the second flexible circuit board.

In the input device according to the above application example, the first terminal that is arranged on the first face of the substrate, the first flexible circuit board that is connected to the first terminal through the anisotropic conductive film, and the second terminal that is arranged in a region of the second face of the substrate, which does not overlap a region opposite the first flexible circuit board may be provided, wherein a region of the second face of the substrate, which overlaps the first flexible circuit board in plan view, may be formed to be a smooth face. According to the above aspect, because the first terminal that is arranged on the first face of the substrate, the first flexible circuit board that is connected to the first terminal through the anisotropic conductive film, and the second terminal that is arranged in the region of the second face of the substrate, which does not overlap the region opposite the first flexible circuit board are provided, and the region of the second face of the substrate, which overlaps the first flexible circuit board in plan view, is formed to be the smooth face, when the first terminal and the first flexible circuit board are, for example, compression bonded and connected, it is possible to perform compression bonding using the smooth face by, for example, the compression bonding member of the compression bonding jig while the second terminal is not placed in between the compression bonding jig. Thus, it is possible to press the substrate and the first flexible circuit board with a uniform force, and it is possible to improve reliability of connection, on the first face side of the substrate, between the first terminal and the first flexible circuit board. In addition, after the above process, when the second terminal and, for example, the second flexible circuit board are compression bonded and connected, the first terminal is not placed in between the compression bonding jig. Thus, even when the substrate and the first flexible circuit board have been already compression bonded, it is possible to press the substrate and the second flexible circuit board with a uniform force, so that it is possible to obtain the input device that improves reliability of connection, on the second face of the substrate, between the second terminal and the second flexible circuit board.

TWELFTH APPLICATION EXAMPLE

In the input device according to the above application example, the second terminal may be arranged in a region of the second face of the substrate, which does not overlap a region opposite the first flexible circuit board. In this manner, when the second terminal and, for example, the second flexible circuit board are compression bonded and connected, the first terminal and the first flexible circuit board are not placed in between the compression bonding jig. Thus, even when the substrate and the first flexible circuit board have been already compression bonded, it is possible to press the substrate and the second flexible circuit board with a uniform force, so that it is possible to improve reliability of connection, on the second face of the substrate, between the second terminal and the second flexible circuit board.

THIRTEENTH APPLICATION EXAMPLE

In the input device according to the above application example, a region of the first face of the substrate, which overlaps the second region in plan view, may be formed to be a smooth face. Thus, because the region of the first face of the substrate, which overlaps the second region in plan view, is formed to be the smooth face, it is possible to press the substrate and the second flexible circuit board with a uniform force, so that it is possible to improve reliability of connection, on the second face side of the substrate, between the second terminal and the second flexible circuit board.

In the input device according to the above application example, the first flexible circuit board may be connected to the second terminal in the second region through the anisotropic conductive film. According to the above aspect, when the second terminal and, for example, the first flexible circuit board are compression bonded and connected, the first terminal and the first flexible circuit board are not placed in between the compression bonding jig. In addition, when the first terminal and, for example, the first flexible circuit board are compression bonded and connected, the second terminal and the first flexible circuit board are not placed in between the compression bonding jig. Thus, even when the substrate and the first flexible circuit board have been already compression bonded, it is possible to press the second terminal, which is arranged in the second region of the second face of the substrate, and the first flexible circuit board with a uniform force. Thus, it is possible to improve reliability of connection between the second terminal, which is arranged in the second region of the second face of the substrate, and the first flexible circuit board.

In the input device according to the above application example, a second flexible circuit board that is connected to the second terminal in the second region through the anisotropic conductive film may be provided.

FOURTEENTH APPLICATION EXAMPLE

In the input device according to the above application example, one of the first flexible circuit board and a second flexible circuit board may be connected to the second terminal in the second region through the anisotropic conductive film. According to the above aspect, when the second terminal and, for example, the second flexible circuit board are compression bonded and connected, the first terminal and the first flexible circuit board are not placed in between the compression bonding jig. Thus, even when the substrate and the first flexible circuit board have been already compression bonded, it is possible to press the substrate and the second flexible circuit board with a uniform force, so that it is possible to improve reliability of connection, on the second face of the substrate, between the second terminal and the second flexible circuit board.

FIFTEENTH APPLICATION EXAMPLE

An aspect of this application example provides a method of manufacturing a mounting structure that is provided with a flexible circuit board connected to a substrate. The mounting structure includes a first terminal that is arranged on a first face of the substrate, a first flexible circuit board that has a first connecting terminal portion connected to the first terminal through an anisotropic conductive film, a second terminal that is arranged on a second face of the substrate, which is a rear face relative to the first face. The mounting structure further includes any one of the first flexible circuit board that has a second connecting terminal portion and a second flexible circuit board that has a connecting terminal portion, which is connected to the second terminal through an anisotropic conductive film. The method of manufacturing the mounting structure includes compression bonding the first terminal with the first connecting terminal portion of the first flexible circuit board using a region of the second face of the substrate, which overlaps the first terminal and is a smooth face, as a compression bonding face, and, after compression bonding the first terminal with the first connecting terminal portion, compression bonding the second terminal that is arranged in a region different from a region of the substrate, which overlaps the first terminal in plan view, with one of the second connecting terminal portion of the first flexible circuit board and the connecting terminal portion of the second flexible circuit board using a region of the first face of the substrate, which overlaps the second terminal and is a smooth face, as a compression bonding face, while avoiding the first connecting terminal portion of the first flexible circuit board.

An aspect of this application example provides a method of manufacturing a mounting structure that includes a substrate, a first flexible circuit board, and a second flexible circuit board. The first flexible circuit board is connected to the substrate. The second flexible circuit board is connected to the substrate. The method of manufacturing the mounting structure includes compression bonding a first terminal that is arranged on a first face of the substrate with the first flexible circuit board using a compression face that is a smooth face, and, after compression bonding the first terminal with the first flexible circuit board, compression bonding a second terminal that is arranged in a region of a second face of the substrate, which is different from a region that overlaps the first terminal in plan view, with the second flexible circuit board using a compression face that is a smooth face, while avoiding the first flexible circuit board.

An aspect of this application example provides a method of manufacturing a mounting structure that includes a substrate and a first flexible circuit board. The first flexible circuit board is connected to the substrate. The method of manufacturing the mounting structure includes compression bonding a first terminal that is arranged on a first face of the substrate with the first flexible circuit board using a compression face that is a smooth face, and compression bonding a second terminal that is arranged in a region of a second face of the substrate, which is different from a region that overlaps the first terminal in plan view, with the first flexible circuit board using a compression face that is a smooth face, while avoiding the first flexible circuit board.

According to the above aspect, because the first terminal that is arranged on the first face of the substrate is compression bonded with the first flexible circuit board using the compression bonding face that is a smooth face, and, after that, the second terminal that is arranged in the region of the second face of the substrate, which is different from the region that overlaps the first terminal in plan view, is compression bonded with the second flexible circuit board using the compression bonding face that is a smooth face, while avoiding the first flexible circuit board, when the first terminal and the first flexible circuit board are, for example, compression bonded and connected, it is possible to compression bond the first flexible circuit board using the compression bonding jig while the second terminal is not placed in between the compression bonding jig. Thus, it is possible to press the substrate and the first flexible circuit board with a uniform force, and it is possible to improve reliability of connection, on the first face side of the substrate, between the first terminal and the first flexible circuit board. In addition, after the above process, when the second terminal and, for example, the second flexible circuit board are compression bonded and connected, the first terminal is not placed in between the compression bonding jig. Thus, even when the substrate and the first flexible circuit board have been already compression bonded, it is possible to press the substrate and the second flexible circuit board with a uniform force, so that it is possible to improve reliability of connection, on the second face of the substrate, between the second terminal and the second flexible circuit board.

In addition, according to the above aspect, even when the first terminal that is arranged in the first region of the first face of the substrate and the first flexible circuit board have been compression bonded, it is possible to press the second terminal that is arranged in the second region of the second face of the substrate and the second flexible circuit board with a uniform force. Thus, it is possible to improve reliability of connection between the second terminal, which is arranged in the second region of the second face of the substrate, and the second flexible circuit board. In addition, as in the case described above, it is possible to improve reliability of connection between the first terminal and the first flexible circuit board on the first face side of the substrate.

An aspect of this application example provides an electronic apparatus that includes the above described mounting structure. According to the above aspect, because the electronic apparatus is provided with the mounting structure that is able to improve connection reliability between the substrate and the circuit board on both front and rear faces (first face and second face) of the substrate, it is possible to obtain an electronic apparatus that has a high display performance.

SIXTEENTH APPLICATION EXAMPLE

An aspect of this application example provides an electronic apparatus that includes the above described electro-optical device. According to the above aspect, because the electronic apparatus is provided with the electro-optical device that is able to improve connection reliability between the substrate and the circuit board on both front and rear faces (first face and second face) of the substrate, it is possible to obtain an electronic apparatus that has a high display performance.

An aspect of this application example provides an electronic apparatus that includes the above described input device. According to the above aspect, because the electronic apparatus is provided with the input device that is able to improve connection reliability between the substrate and the circuit board on both front and rear faces (first face and second face) of the substrate, it is possible to obtain an electronic apparatus that has a high display performance.

BRIEF DESCRIPTION OF THE DRAWINGS

The invention will be described with reference to the accompanying drawings, wherein like numbers reference like elements.

FIG. 20A and FIG. 20B are schematic wiring diagrams of the touch panel according to the third embodiment.

FIG. 23A to FIG. 23C are schematic terminal arrangement diagrams that show alternative embodiments in terms of arrangement of the connecting terminal portions.

DESCRIPTION OF EXEMPLARY EMBODIMENTS

Hereinafter, embodiments will be described with reference to the accompanying drawings. Note that, for describing the following embodiments, a mounting structure, a liquid crystal device, which serves as an electro-optical device, specifically, a transflective TFT (Thin Film Transistor) active matrix liquid crystal device, a method of manufacturing the liquid crystal device, and electronic apparatuses that use the liquid crystal device will be described, but the aspects of the invention are not limited to them. In addition, in the accompanying drawings, to make it easier to recognize configurations, the scale and/or number of components in each structure are varied from those of the actual structure.

First Embodiment

Figure 1:
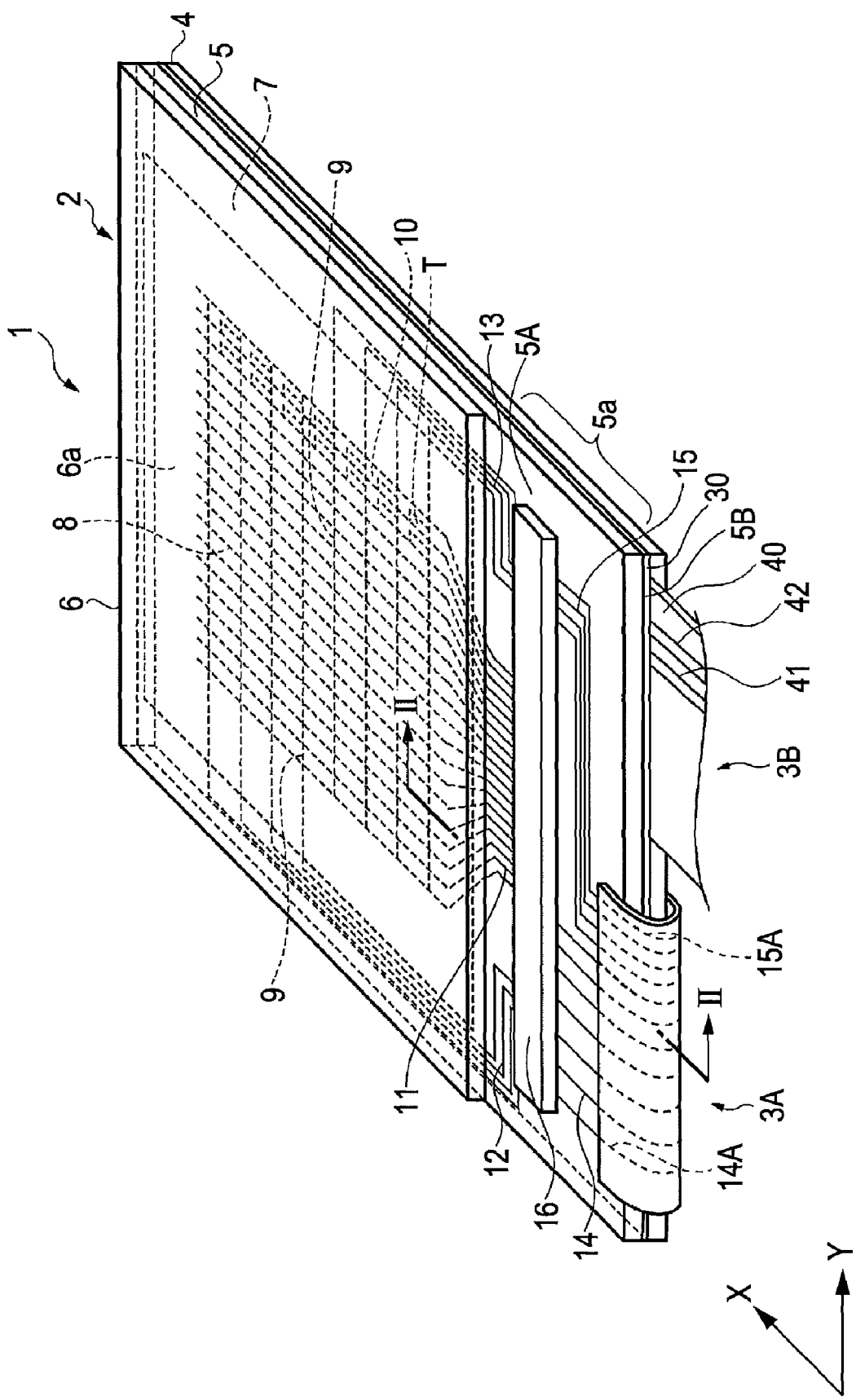
FIG. 1 is a schematic perspective view of a liquid crystal device according to a first embodiment of the invention.
Figure 2:
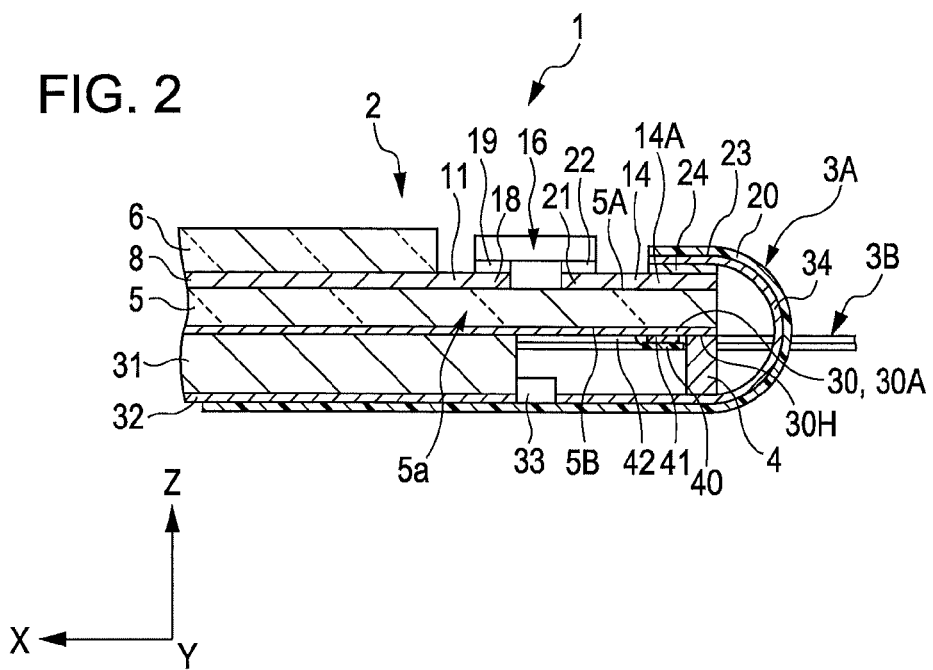
FIG. 2 is a cross-sectional view of the liquid crystal device, taken along the line II-II in FIG. 1.
Figure 3:
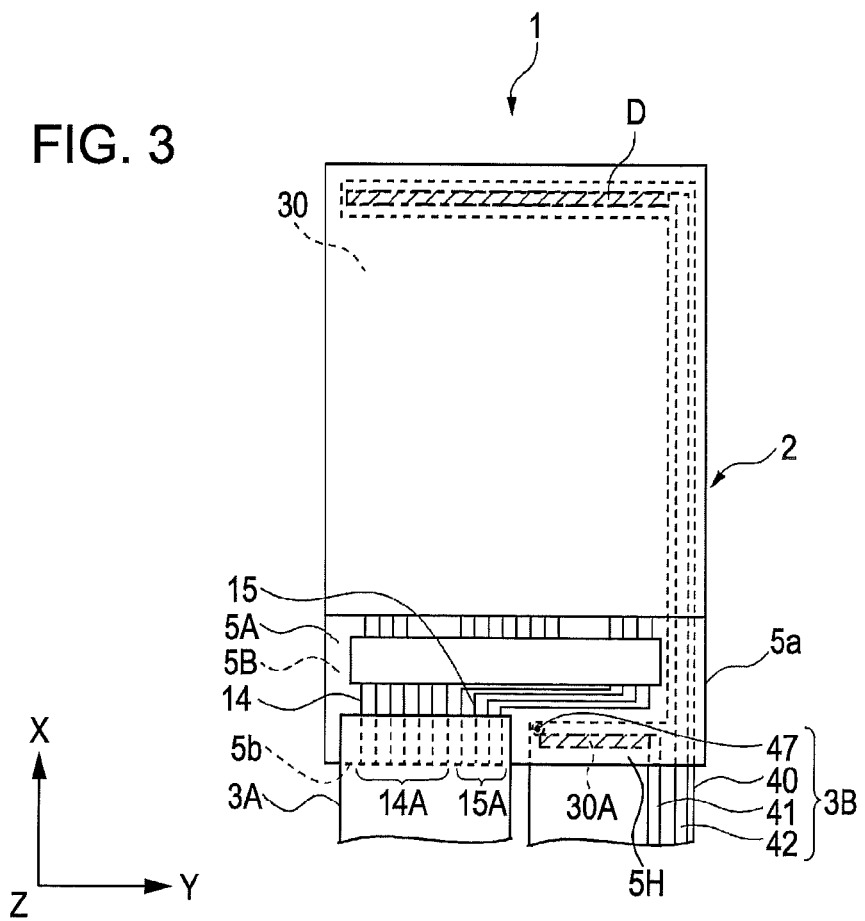
FIG. 3 is a schematic plan view of the liquid crystal device shown in FIG. 1.
Figure 4:
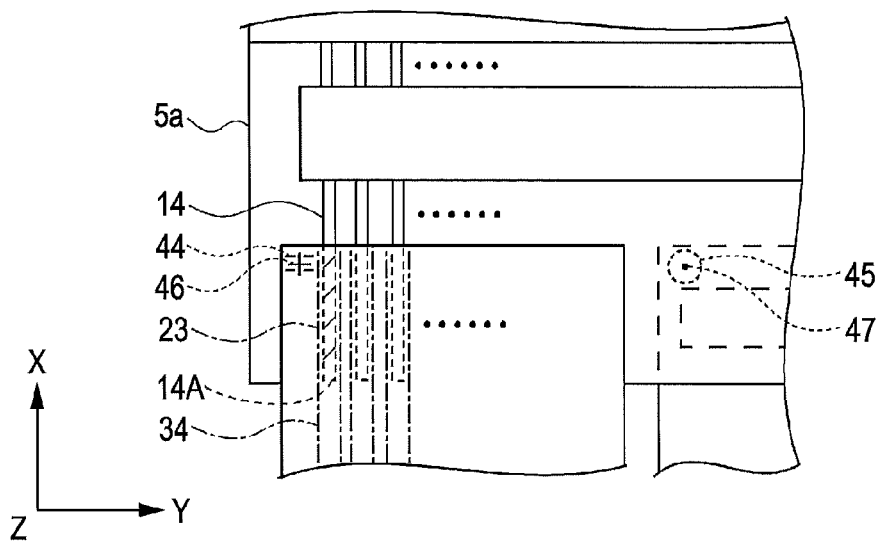
FIG. 4 is a partially enlarged plan view of an extended portion of a liquid crystal panel of the liquid crystal device shown in FIG. 3.

FIG. 1 is a schematic perspective view of a liquid crystal device according to a first embodiment. FIG. 2 is a cross-sectional view of the liquid crystal device, taken along the line II-II in FIG. 1. FIG. 3 is a schematic plan view of the liquid crystal device shown in FIG. 1. FIG. 4 is a partially enlarged plan view of an extended portion of a liquid crystal panel of the liquid crystal device shown in FIG. 3. Note that FIG. 3 and FIG. 4 each show a state before a first flexible circuit board 3A, which will be described later, is bent.

Configuration of Liquid Crystal Device

As shown in FIG. 1, a liquid crystal device 1 includes a liquid crystal panel 2, a first flexible circuit board 3A connected to the liquid crystal panel 2, and a second flexible circuit board 3B. Note that the liquid crystal device 1 is provided with other additional mechanisms, such as a frame 4 that supports the liquid crystal panel 2, where appropriate.

The liquid crystal panel 2 includes a substrate 5, a substrate 6 that is provided so as to be opposed to the substrate 5, a seal material 7 that is provided between the substrates 5, 6, and a liquid crystal (not shown) that is sealed by the substrates 5, 6. The liquid crystal, for example, employs a TN (Twisted Nematic) liquid crystal.

The substrate 5 and the substrate 6 are plate-like members that are, for example, formed of translucent material, such as glass or synthetic resin. Gate electrodes 8, source electrodes 9, thin-film transistor elements T and pixel electrodes 10 are formed on a first face 5A, which is a face of the substrate 5 on a side adjacent to the liquid crystal to form a display portion, and a common electrode 6a is formed on a side of the substrate 6 adjacent to the liquid crystal. First terminals are electrically connected to the display portion.

The gate electrodes 8 are, for example, formed of metal material, such as aluminum, and extend in an X direction, and the source electrodes 9 are, for example, formed of metal material, such as aluminum, and extend in a Y direction. The source electrodes 9 are, for example, as shown in FIG. 1, formed so that the upper half of them are extended to the left side and the lower half of them are extended to the right side. Note that the number of the gate electrodes 8 and the number of the source electrodes 9 may be appropriately changed in accordance with a resolution of the liquid crystal device 1 and/or the size of a display area.

Each of the thin-film transistor elements T has three terminals that are respectively connected to the gate electrode 8, the source electrode 9 and the pixel electrode 10. That is, each thin-film transistor element T is connected to the pixel electrode 10, the gate electrode 8, and the source electrode 9. In this manner, when a voltage is applied to the gate electrodes 8, electric current flows from the source electrodes 9 to the pixel electrodes 10 or flows in the opposite direction.

In addition, the substrate 5 has a region (hereinafter, referred to as "extended portion") 5*a* that extends beyond the outer periphery of the substrate 6. Output wirings 11 to 13 and input wirings 14, 15 are formed on the first face 5A of the extended portion 5*a*, and a driver IC 16 is, for example, mounted on the first face 5A of the extended portion 5*a*.

As shown in FIG. 2, one end portions 18 of the output wirings 11 are connected to a driver side output terminal 19 of the driver IC 16, and the other ends are connected to the gate electrodes 8. One end portions of the output wirings 12 and output wirings 13 are connected to driver side output terminals (not shown) of the driver IC 16, and the other ends are connected to the source electrodes 9.

As shown in FIG. 2, one end portions 21 of the input wirings 14 are connected to a driver side input terminal 22 of the driver IC 16. As shown in FIG. 2 and FIG. 3, connecting terminal portions 14A, which serves as the first terminals, arranged in a first region are provided at the other ends of the input wirings 14.

As shown in FIG. 2 and FIG. 3, the connecting terminal portions 14A are arranged on the first face 5A of the substrate 5. As shown in FIG. 2, the connecting terminal portions 14A are connected to connecting portions 23, which are formed on one face side of the first flexible circuit board 3A having a flexibility, through an ACF (Anisotropic Conductive Film) 24, or the like. As shown in FIG. 4, the plurality of connecting terminal portions 14A are arranged, and at least one of the plurality of connecting terminal portions 14A is formed of transparent conductive material, such as ITO (Indium Tin Oxide). In the present embodiment, among the plurality of connecting terminal portions 14A, a connecting terminal portion 14A (connecting terminal portion 14A indicated by the diagonal line in FIG. 4) that is arranged on the outermost side of the liquid crystal panel 2 in a direction (Y direction in FIG. 4) that intersects at a right angle with a longitudinal direction (X direction in FIG. 4) of the liquid crystal panel 2 is formed of transparent conductive material.

As shown in FIG. 3, one end portions of the input wirings 15 are respectively connected to driver side input terminals (not shown) of the driver IC 16 through an ACF, and connecting terminal portions 15A, which also serve as the first terminals, are connected to a connecting portion (not shown) formed on one face side of the first flexible circuit board 3A through the ACF 24. The connecting terminal portions 15A are portions indicated by the dotted line in FIG. 3.

As shown in FIG. 2, the driver IC 16 includes the driver side input terminal 22 and the driver side output terminal 19, which are formed on the mounting face side of the driver IC 16 and extend therefrom. The driver IC 16 is mounted on the side of the substrate 5 through an adhesive, such as the ACF 24, for example.

As shown in FIG. 3, the extended portion 5*a* of the substrate 5 has a one side 5*b* that overlaps the first flexible circuit board 3A in plan view.

As shown in FIG. 4, a first mark 44 and second marks 45 are arranged on the extended portion 5*a*. The first mark 44 is used for alignment with the first flexible circuit board 3A, which will be described later. The second marks 45 are used for alignment with the second flexible circuit board 3B, which will be described later. The first mark 44 is, for example, four parallel line segments arranged at predetermined intervals. The second marks 45 each have, for example, a circular shape. Note that a plurality of the second marks 45 are formed (not shown). In addition, the shape, number and region to be arranged, or the like, of the first and second marks 44, 45 are not specifically limited.

Furthermore, the substrate 5 has a smooth face 5H in a region of the first face 5A, which overlaps the second flexible circuit board 3B in plan view. Here, the smooth face 5H is in a state where the first face 5A of the substrate 5 is exposed and in a state where a wiring, a connecting terminal, an electronic component, or the like, is not arranged thereon. In compression bonding or after compression bonding, the smooth face 5H may be in a non-exposed state, for example, by being covered with a protective tape film or an electronic component. As shown in FIG. 1 and FIG. 2, a transparent conductive film 30 is, for example, arranged on a second face 5B, which is a rear side (opposite side) of the substrate 5 to the first face 5A so as to overlap the second face 5B in plan view. The substrate 5 has a smooth face in which the second face 5B is exposed in a region of the second face 5B, which overlaps the first flexible circuit board 3A in plan view, and the transparent conductive film 30 that overlaps the smooth face has a smooth face 30H. The transparent conductive film 30 is, for example, formed of transparent conductive material, such as ITO. As shown in FIG. 3, the transparent conductive film 30 includes a connecting terminal portion 30A, which serves as a second terminal, arranged on part of the transparent conductive film 30 and in a second region. FIG. 3 shows the connecting terminal portion 30A by the diagonal line. The connecting terminal portion 30A is a portion to which the end portion of a first heater wiring 41, which will be described later, is compression bonded so as to overlap each other in plan view. As shown in FIG. 3, the connecting terminal portion 30A, which serves as the second terminal, is arranged in a region of the second face 5B of the substrate 5, which does not overlap a region opposite the first flexible circuit board 3A. In other words, the connecting terminal portion 30A is arranged in a region of the second face 5B of the substrate 5, which is different from (does not overlap) a region that overlaps the first flexible circuit board 3A in plan view. As shown in FIG. 3, the connecting terminal portion 30A is arranged in a region that is different in plan view from (does not overlap) the connecting terminal portions 14A and 15A, which serve as the first terminals.

As shown in FIG. 2, a light guide plate 31 and a reflector plate 32 are arranged on a side of the transparent conductive film 30, opposite to a side on which the substrate 5 is provided. The light guide plate 31 is arranged so as to overlap the substrate 5 in plan view through the transparent conductive film 30. The light guide plate 31 is used to guide light emitted from a LED 33, which will be described later, in a longitudinal direction (in the X direction of FIG. 2), or the like, of the substrate 5. The reflector plate 32 is used to reflect light emitted from the LED 33 toward the liquid crystal side.

As shown in FIG. 2, one end portion of the first flexible circuit board 3A is connected to the extended portion 5*a* through, for example, the ACF 24, and the other end portion is bent and bonded to the reflector plate 32. As shown in FIG. 3, the first flexible circuit board 3A is connected to the left side of the substrate 5 in a direction parallel to the one side 5*b* (in the Y direction in FIG. 3) near the one side 5*b*.

As shown in FIG. 2, the first flexible circuit board 3A includes a flexible base material 20, the connecting portions 23, the LED 33, wirings 34 extended onto the flexible base material 20, and a third mark 46 shown in FIG. 4.

The flexible base material 20 is used as a base material of the first flexible circuit board 3A and is, for example, formed of resin material, or the like. The resin material may be, for example, polyimide. As shown in FIG. 2, the other end portion of the flexible base material 20 is bonded to the reflector plate 32 by means of an adhesive, or the like.

As shown in FIG. 2, the connecting portions 23 are connected to the connecting terminal portions 14A through the ACF 24. The connecting portions 23 are connected to the wirings 34 that are extended onto the flexible base material 20.

As shown in FIG. 2, the LED 33 is connected to the wirings 34 and mounted on the flexible base material 20. The LED 33 is arranged, for example, on the flexible base material 20 so as to be located in proximity to the light guide plate 31 in order to be able to emit light toward the light guide plate 31.

As shown in FIG. 4, the third mark 46 has a cross shape. As shown in FIG. 4, the third mark 46 is used for alignment between the substrate 5 and the first flexible circuit board 3A, which will be described later. Note that the shape, number, position, and the like, of the third mark 46 are not specifically limited.

The second flexible circuit board 3B has a flexibility, and, as shown in FIG. 3, is connected to the second face 5B side of the substrate 5 in a region that is deviated in a direction parallel to the one side 5b (in the Y direction in FIG. 3, as a transverse direction) from a region in which the substrate 5 is connected to the first flexible circuit board 3A. As shown in FIG. 3, the second flexible circuit board 3B is connected to the second face 5B side of the substrate 5 in a region of the second face 5B, which is different from a region that overlaps the connecting terminal portions 14A, 15A in plan view.

As shown in FIG. 3, the second flexible circuit board 3B includes a resin substrate 40, such as polyimide, for corrosion prevention, the first heater wiring 41 and a second heater wiring 42, which are used for supplying electric power to the transparent conductive film 30, and fourth marks 47 (see FIG. 4).

As shown in FIG. 2 and FIG. 3, the first heater wiring 41 is connected to the connecting terminal portion 30A, which serves as the second terminal, through the ACF 24, which is not shown in FIG. 3.

As shown in FIG. 3, the second heater wiring 42 is extended, for example, to an end portion of the substrate 5, opposite to the one side 5b in the longitudinal direction so as to be parallel to the one side 5b, and is connected to the transparent conductive film 30 through the ACF 24 (not shown). The second heater wiring 42 is, for example, connected to the transparent conductive film 30 in a region D indicated by the diagonal line in FIG. 3. Note that the second heater wiring 42 is, for example, grounded.

As shown in FIG. 4, the fourth marks 47 have a dot shape. The fourth marks 47 are used for alignment between the substrate 5 and the second flexible circuit board 3B. Note that a plurality of the fourth marks 47 are formed (not shown in the drawing). In addition, the shape, number and position of the fourth marks 47 are not particularly limited.

Method of Manufacturing Liquid Crystal Device

Next, a method of manufacturing the liquid crystal device according to the first embodiment will be described with reference to the accompanying drawings.

Figure 5:
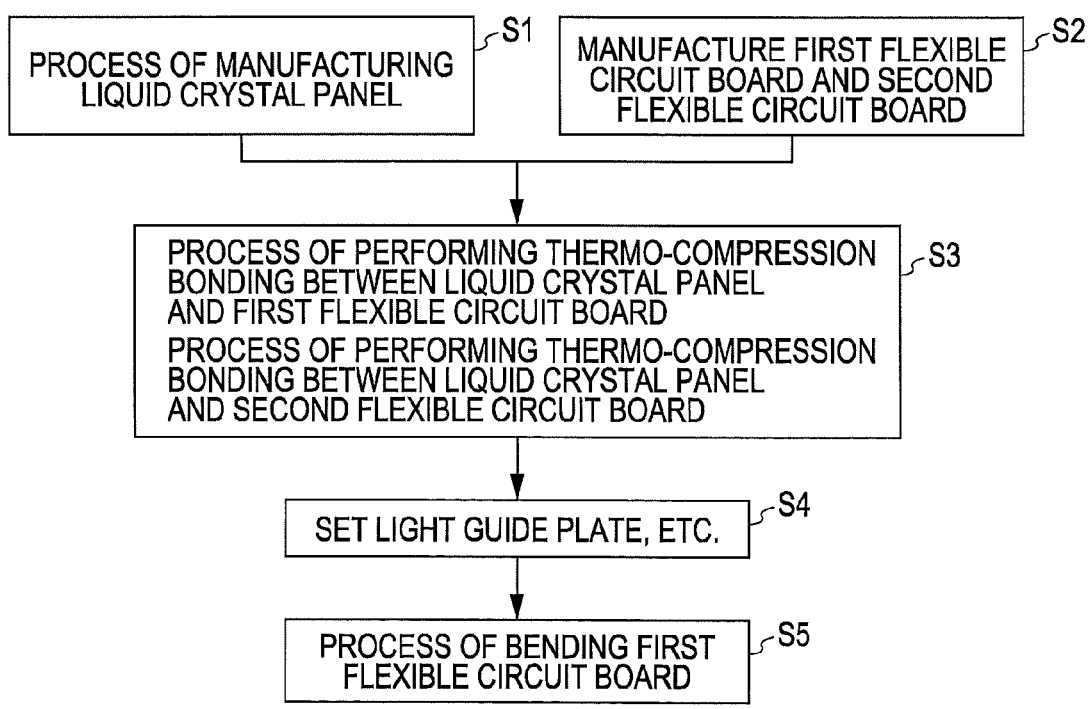
FIG. 5 is a flowchart of the process of manufacturing the liquid crystal device according to the first embodiment.
Figure 6:
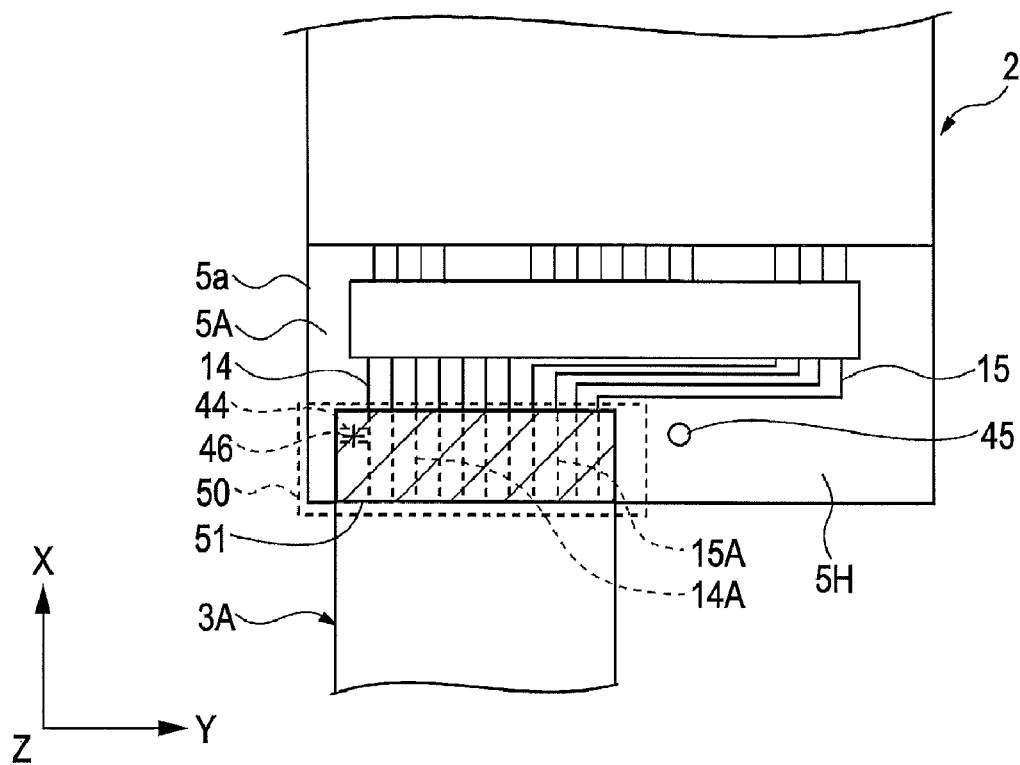
FIG. 6 is a schematic plan view of the state of performing compression bonding between a substrate and a first flexible circuit board.
Figure 7:
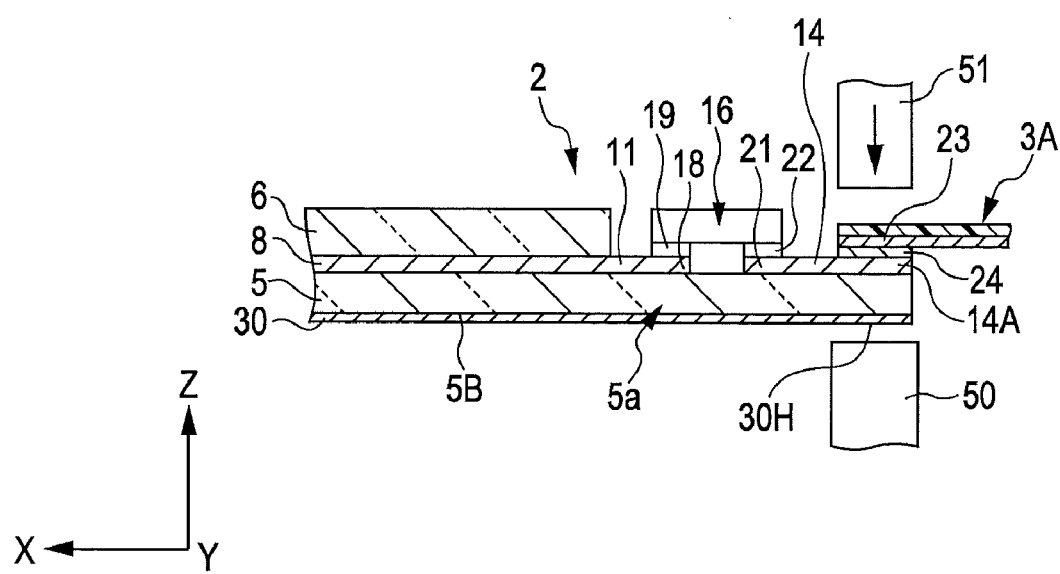
FIG. 7 is a schematic cross-sectional view of the state of performing compression bonding between the substrate and the first flexible circuit board.
Figure 8:
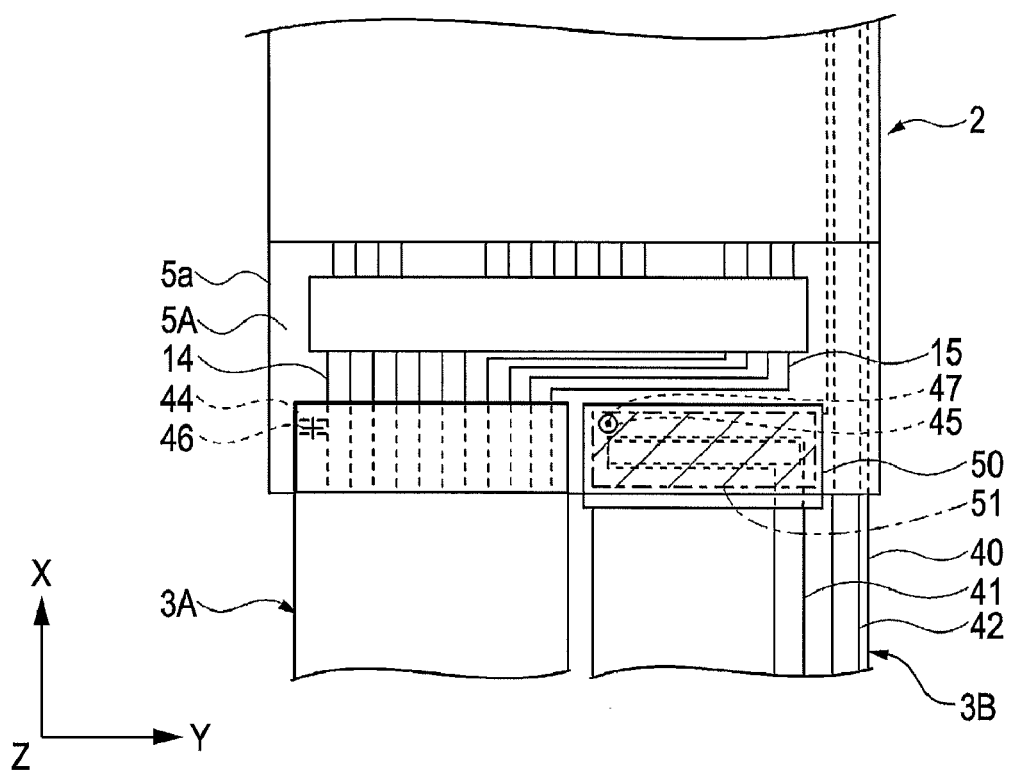
FIG. 8 is a schematic plan view of the state of compression bonding between the substrate and a second flexible circuit board.
Figure 9:
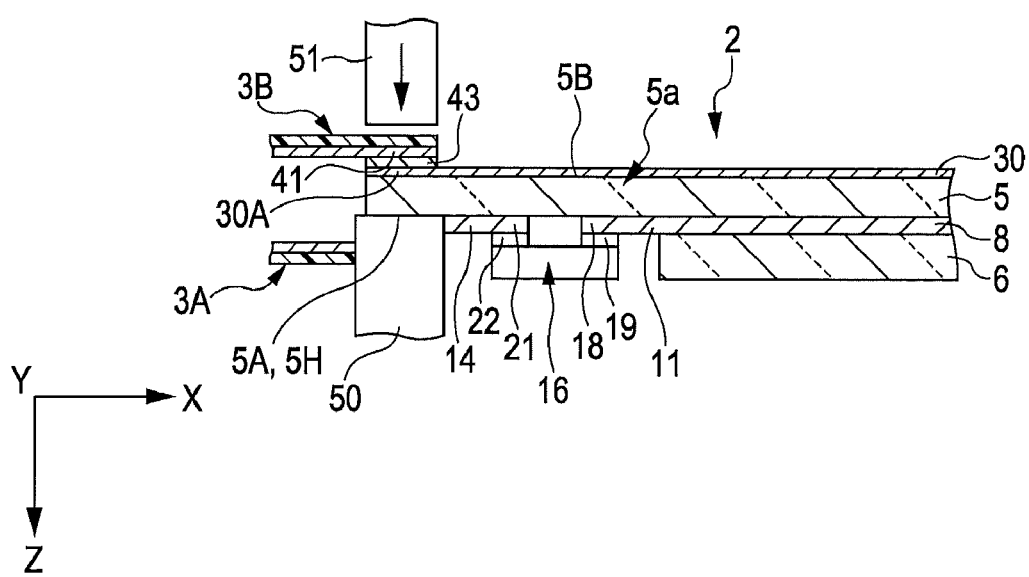
FIG. 9 is a schematic cross-sectional view of the state of compression bonding between the substrate and the second flexible circuit board.

FIG. 5 is a flowchart of the process of manufacturing the liquid crystal device 1 according to the first embodiment. FIG. 6 is a schematic plan view of the state of performing compression bonding between the substrate 5 and the first flexible circuit board 3A. FIG. 7 is a schematic cross-sectional view of the state of performing compression bonding between the substrate 5 and the first flexible circuit board 3A. FIG. 8 is a schematic plan view of the state of performing compression bonding between the substrate 5 and the second flexible circuit board 3B. FIG. 9 is a schematic cross-sectional view of the state of performing compression bonding between the substrate 5 and the second flexible circuit board 3B. Note that, in the present embodiment, the process of extending the input wirings 15 formed on the extended portion 5a of the liquid crystal panel 2, the process of compression bonding (S3) the first flexible circuit board 3A and the process of compression bonding (S3) the second flexible circuit board 3B will be specifically described.

First, the liquid crystal panel 2 is manufactured (S1). At this time, as shown in FIG. 3, wirings, such as the input wirings 15, provided on the substrate 5 are arranged at least in a region that is different from a region that overlaps the connecting terminal portion 30A in plan view. In addition, as shown in FIG. 4, the first mark 44 and the second marks 45 are formed on the extended portion 5a. Furthermore, the transparent conductive film 30 is formed on the second face 5B side of the substrate 5 using transparent conductive material, such as ITO.

Next, the first flexible circuit board 3A and the second flexible circuit board 3B are manufactured (S2). At this time, the third mark 46 is formed on the first flexible circuit board 3A, as shown in FIG. 4, so as to correspond to the first mark 44, and the fourth marks 47 are formed on the second flexible circuit board 3B so as to correspond to the second marks 45. Note that the plurality of second marks 45 are formed at different positions.

Subsequently, by placing the liquid crystal panel 2 on a stage (not shown), or the like, the first mark 44 and the third mark 46 are aligned by looking through a camera, or the like, as shown in FIG. 6. Thus, the liquid crystal panel 2 and the first flexible circuit board 3A are aligned. At this time, for example, by reliably looking positions of the connecting portions 23 of the first flexible circuit board 3A through the transparent substrate 5 and the transparent connecting terminal portion 14A, accurate alignment is performed.

Then, as shown in FIG. 6 and FIG. 7, by vertically moving compression bonding heads 50, 51, the connecting terminal portions 14A, 15A arranged on the first face 5A of the substrate 5 and the connecting portions 23 of the first flexible circuit board 3A are thermally compression bonded through the ACF 24 (S3). Thus, the region indicated by the diagonal line in FIG. 6 is pressed. At this time, as shown in FIG. 7, for example, there is no component placed between the second face 5B (transparent conductive film 30) of the substrate 5 and the compression bonding head 50, a smooth face is exposed on the second face 5B of the substrate 5, and the transparent conductive film 30 has the smooth face 30H. Thus, the plurality of connecting portions 23 and the connecting terminal portions 14A are uniformly pressed. Note that the compression bonding heads 50, 51 have smooth faces that press the transparent conductive film 30 and the first flexible circuit board 3A, respectively.

After thermocompression bonding, the degree of flattening of conductive particles of the ACF 24 between the transparent connecting terminal portion 14A and the connecting portion 23, or the like, is observed, for example, through the transparent substrate 5 and the transparent connecting terminal portion 14A. In this manner, it is confirmed whether it is in an appropriate compression bonded state on the basis of the degree of flattening of conductive particles, and, when it is inappropriate, it is possible to ensure an appropriate compression bonded state by further pressing, or the like.

After that, the liquid crystal panel 2 is placed, or the like, on a stage (not shown) (see FIG. 9), and, as shown in FIG. 8, the second marks 45 and the fourth marks 47 are aligned by looking through a camera, or the like. Thus, the liquid crystal panel 2 and the second flexible circuit board 3B are aligned.

Next, as shown in FIG. 8 and FIG. 9, by vertically moving compression bonding heads 50, 51, or the like, the connecting terminal portion 30A of the transparent conductive film 30, arranged on the second face 5B of the substrate 5, and the first heater wiring 41 of the second flexible circuit board 3B are thermally compression bonded through the ACF 43 (S3). In this manner, the region indicated by the diagonal line in FIG. 8 is pressed. At this time, as shown in FIG. 9, for example, there is no component placed between the first face 5A of the substrate 5 and the compression bonding head 50, and the first face 5A has the smooth face 5H. Thus, the first heater wiring 41 and the connecting terminal portion 30A are uniformly pressed. Here, the smooth face 5H is in a state where the first face 5A of the substrate 5 is exposed and in a state where a wiring, a connecting terminal, an electronic component, or the like, is not arranged thereon. In compression bonding or after compression bonding, the smooth face 5H may be in a non-exposed state, for example, by being covered with a protective tape film or an electronic component.

After thermocompression bonding, the degree of flattening of conductive particles of the ACF 43 between the connecting terminal portion 30A and the first heater wiring 41, or the like, is observed, for example, through the transparent substrate 5 and the transparent connecting terminal portion 30A. In this manner, it is confirmed whether it is in an appropriate compression bonded state on the basis of the degree of flattening of conductive particles, and, when it is inappropriate, it is possible to ensure an appropriate compression bonded state by further pressing, or the like.

Next, the frame 4, the light guide plate 31, and the like, are fixed to the liquid crystal panel 2 (S4).

Then, the first flexible circuit board 3A is bent from the extended portion 5a side of the substrate 5 to the frame 4 side in a substantially U-shape, and then the other end portion of the first flexible circuit board 3A is, for example, fixed to the reflector plate 32 side, or the like, to thereby manufacture the liquid crystal device 1 (S5).

With that, the description of the method of manufacturing the liquid crystal device 1 ends.

According to the present embodiment as described above, the connecting terminal portions 14A arranged on the first face 5A and the connecting terminal portion 30A arranged in a region of the second face 5B, which does not overlap a region opposite the first flexible circuit board 3A are provided, and the smooth face (smooth face 30H) is provided in a region of the second face 5B of the substrate 5, which overlaps the first flexible circuit board 3A in plan view. Thus, for example, when the connecting terminal portions 14A and the first flexible circuit board 3A are connected by compression bonding as shown in FIG. 7, the connecting terminal portion 30A and the end portion of the first heater wiring 41 are not placed between the compression bonding head 50 and the compression bonding head 51, so that it is possible to perform compression bonding using the smooth face 30H by the compression bonding head 50. Thus, it is possible to press the substrate 5 and the first flexible circuit board 3A with a uniform force, and it is possible to improve reliability of connection, on the first face 5A side of the substrate 5, between the connecting terminal portions 14A and the first flexible circuit board 3A.

In addition, after the above process, as shown in FIG. 9, when the connecting terminal portion 30A and the second flexible circuit board 3B are connected by compression bonding, the connecting terminal portions 14A, or the like, are not placed between the compression bonding head 50 and the compression bonding head 51, so that it is possible to perform compression bonding using the smooth face 5H by the compression bonding head 50. Thus, even when the substrate 5 and the first flexible circuit board 3A have been compression bonded, it is possible to press the substrate 5 and the second flexible circuit board 3B with a uniform force, and it is possible to improve reliability of connection, on the second face 5B side of the substrate 5, between the connecting terminal portion 30A and the second flexible circuit board 3B.

Moreover, as shown in FIG. 3, the input wirings 14, 15 are extended to a region different from a region that overlaps the connecting terminal portion 30A in plan view. In this manner, for example, when the substrate 5 and the second flexible circuit board 3B are compression bonded after the substrate 5 and the first flexible circuit board 3A have been compression bonded, as shown in FIG. 9, only the substrate 5, the connecting terminal portion 30A and the second flexible circuit board 3B are placed between the compression bonding head 50 and the compression bonding head 51, so that it is possible to prevent the input wirings 15, or the like, from being placed between the compression bonding heads 50, 51. The connecting terminal portion 30A cannot be pressed uniformly if the input wirings 15, or the like, are placed between the compression bonding heads 50, 51. In contrast, the second flexible circuit board 3B may be pressed uniformly against the connecting terminal portion 30A. As a result, without any influence of the input wirings 15, and the like, it is possible to improve reliability of connection between the connecting terminal portion 30A, which is arranged on the substrate 5, and the first heater wiring 41 of the second flexible circuit board 3B.

In addition, the substrate 5 is transparent, and at least one of the plurality of connecting terminal portions 14A has a transparent portion. For example, at least one of the plurality of connecting terminal portions 14A is formed of transparent conductive material. In this manner, for example, after the first flexible circuit board 3A has been compression bonded to the substrate 5 through the ACF 24, it is possible to easily observe the state of conductive particles through the transparent substrate 5 and the transparent connecting terminal portion 14A. Thus, by appropriately adjusting, for example, the compression bonding between the substrate 5 and the first flexible circuit board 3A on the basis of the observation result, it is possible to improve reliability of connection between the connecting terminal portions 14A and the connecting portions 23 of the first flexible circuit board 3A. In addition, by looking, for example, the connecting portions 23 of the first flexible circuit board 3A through the transparent substrate 5 and the transparent connecting terminal portion 14A, it is possible to accurately perform alignment of the first flexible circuit board 3A to the substrate 5 before compression bonding.

Furthermore, the first mark 44 that is used for alignment with the first flexible circuit board 3A and the second marks 45 that are used for alignment with the second flexible circuit board 3B are formed on the substrate 5. In addition, the third mark 46 used for alignment with the substrate 5 is formed on the first flexible circuit board 3A so as to correspond to the first mark 44. Furthermore, the fourth marks 47 used for alignment with the substrate 5 are formed on the second flexible circuit board 3B so as to correspond to the second marks 45. Thus, by using the first mark 44 and the third mark 46, it is possible to perform alignment between the substrate 5 and the first flexible circuit board 3A, and, by using the second marks 45 and the fourth marks 47, it is possible to perform alignment between the substrate 5 and the second flexible circuit board 3B. At this time, because the first mark 44 corresponds to the third mark 46, and the second marks 45 correspond to the fourth marks 47, it is possible to reliably, accurately and easily perform alignment between the substrate 5 and the first flexible circuit board 3A and alignment between the substrate 5 and the second flexible circuit board 3B.

Figure 10:
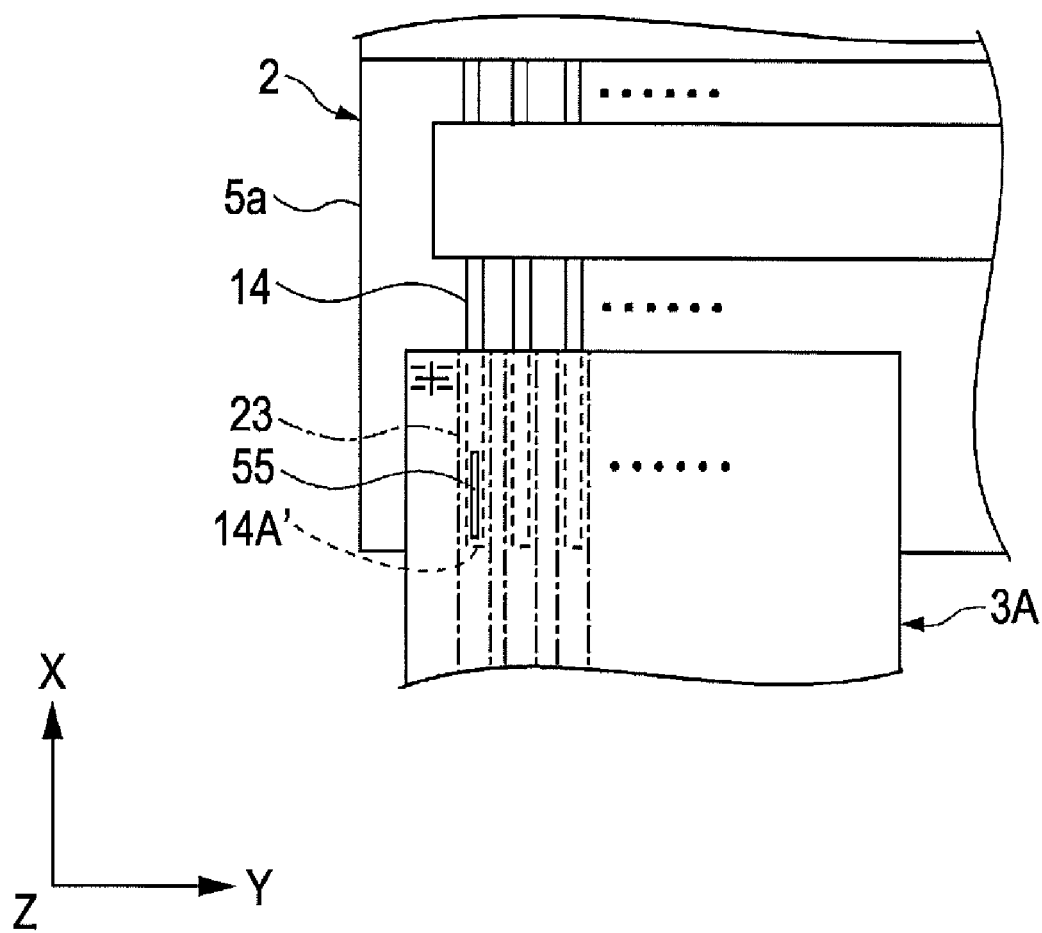
FIG. 10 is a partial plan view of a liquid crystal panel that is provided with connecting terminal portions, one of which has a through-hole formed therein.

FIG. 10 is a partial plan view of a liquid crystal panel that is provided with connecting terminal portions, one of which has a through-hole formed therein.

In the first embodiment, in order to align the substrate 5 with the first flexible circuit board 3A and to observe the state of conductive particles of the ACF 24, the configuration in which the transparent connecting terminal portion 14A is provided is exemplified. However, as shown in FIG. 10, for example, in place of the transparent connecting terminal portion 14A, a connecting terminal portion 14A' that has a through-hole 55 formed therein may be provided.

With the above configuration as well, for example, after the first flexible circuit board 3A has been compression bonded to the substrate 5 through the ACF 24, it is possible to easily observe the state of conductive particles between the connecting terminal portions 14A' and the connecting portions 23 of the first flexible circuit board 3A through the transparent substrate 5 and the through-hole 55 of the connecting terminal portion 14A'. Thus, by appropriately adjusting, for example, the compression bonding between the substrate 5 and the first flexible circuit board 3A on the basis of the observation result, it is possible to improve reliability of connection between the connecting terminal portions 14A' and the connecting portions 23 of the first flexible circuit board 3A. In addition, by looking, for example, the connecting portions 23 of the first flexible circuit board 3A through the transparent substrate 5 and the through-hole 55 of the connecting terminal portion 14A', it is possible to accurately perform alignment of the first flexible circuit board 3A to the substrate 5 before compression bonding. Note that it is exemplified that the through-hole 55 is formed in the connecting terminal portion 14A'. However, a cutout portion (not shown) may be formed in the connecting terminal portion 14A' instead. According to the above configuration, it is possible to easily observe the state of conductive particles between the connecting terminal portions and the connecting portions 23 of the first flexible circuit board 3A through the transparent substrate 5 and the cutout portion of the connecting terminal portion.

Second Embodiment

Next, a second embodiment according to the invention will be described. Note that the same reference numerals are assigned to the same components in the following embodiments as those of the first embodiment, and the description thereof is omitted. The different portions will be particularly described. In addition, in regard to a method of manufacturing the liquid crystal device as well, the portions different from those of the first embodiment will be particularly described.

Figure 11:
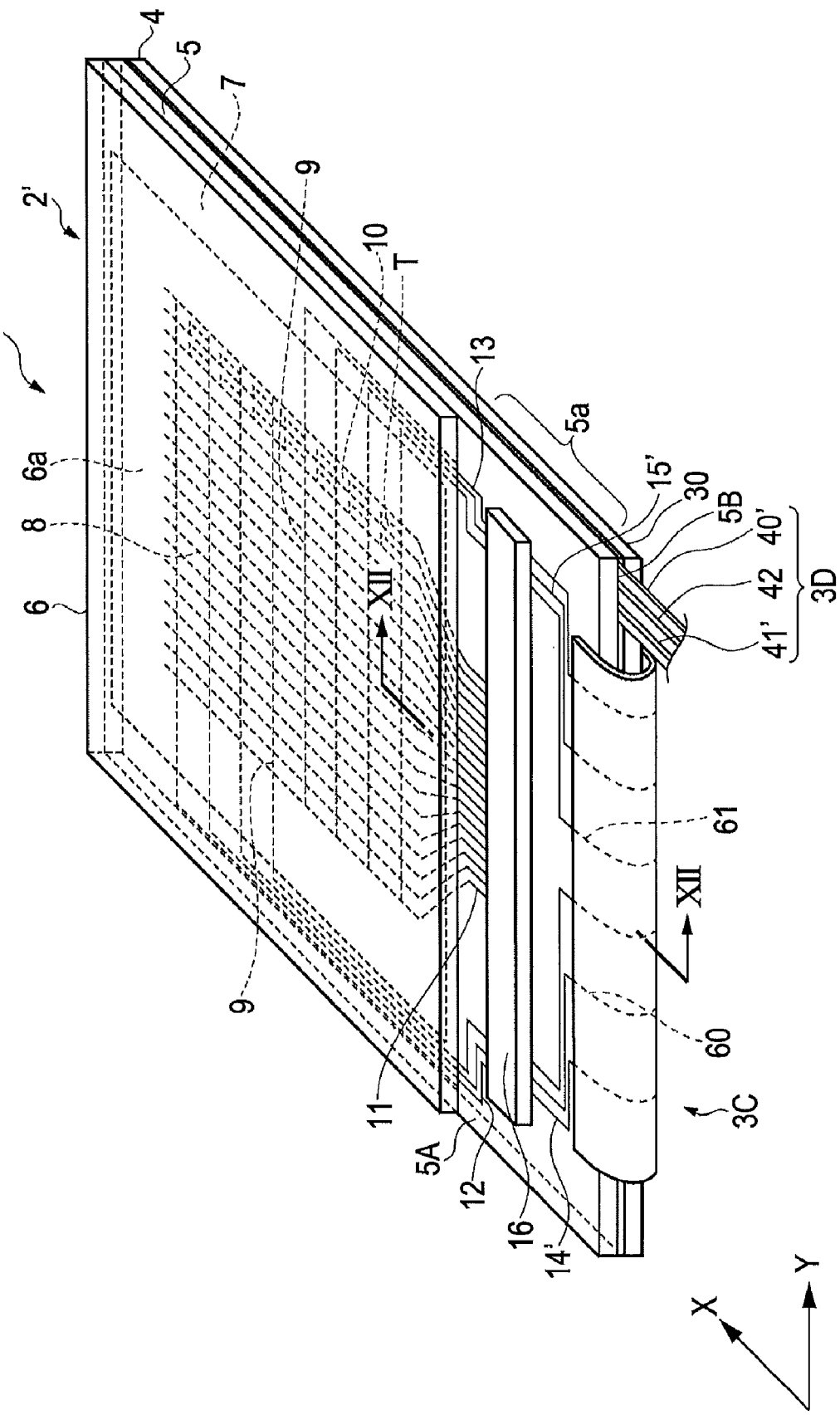
FIG. 11 is a schematic perspective view of a liquid crystal device according to a second embodiment of the invention.
Figure 12:
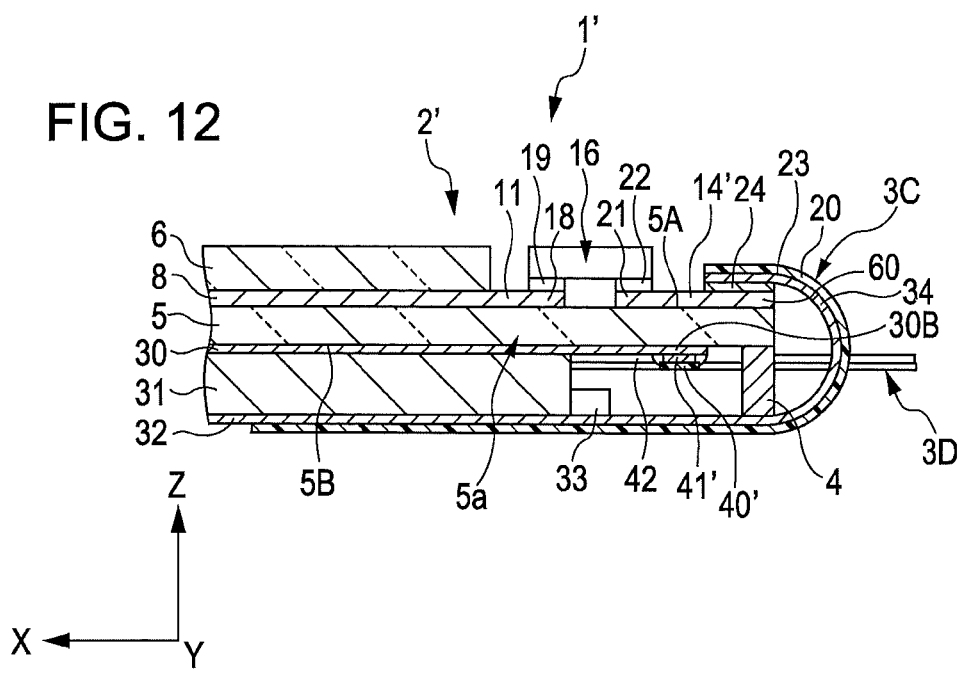
FIG. 12 is a cross-sectional view of the liquid crystal device, taken along the line XII-XII in FIG. 11.
Figure 13:
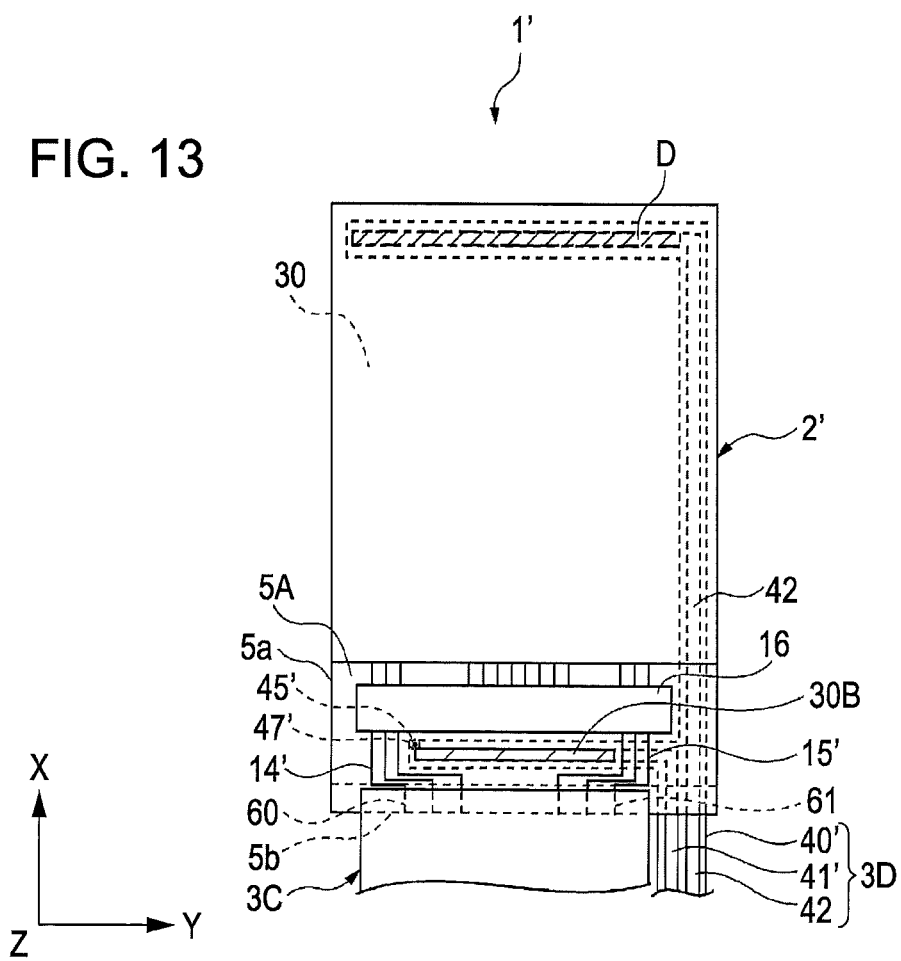
FIG. 13 is a schematic plan view of the liquid crystal device shown in FIG. 11.

FIG. 11 is a schematic perspective view of a liquid crystal device according to the second embodiment. FIG. 12 is a cross-sectional view of the liquid crystal device, taken along the line XII-XII in FIG. 11. FIG. 13 is a schematic plan view of the liquid crystal device shown in FIG. 11.

Configuration of Liquid Crystal Device

A liquid crystal device 11 according to the second embodiment differs from the liquid crystal device 1 according to the first embodiment in a connection region of a first flexible circuit board 3C to a liquid crystal panel 2', which will be described later, and in a connection region of a second flexible circuit board 3D to the liquid crystal panel 2'.

As shown in FIG. 11, the liquid crystal device 1' includes the liquid crystal panel 2', the first flexible circuit board 3C connected to the liquid crystal panel 2', and the second flexible circuit board 3D. Note that the liquid crystal device 1' is provided with other additional mechanisms, such as the frame 4 that supports the liquid crystal panel 2', where appropriate.

The liquid crystal panel 2' is provided with input wirings 14', 15' in place of the input wirings 14, 15 of the liquid crystal panel 2 of the first embodiment.

As shown in FIG. 12, one end portions 21 of the input wirings 14' are connected to the driver side input terminal 22 of the driver IC 16. As shown in FIG. 12 and FIG. 13, connecting terminal portions 60, which serve as the first terminals and arranged in a first region, are provided at the other ends of the input wirings 14'. As shown in FIG. 13, the input wirings 14' are extended to a region different from a region that overlaps a heater input terminal portion 30B, which will be described later, in plan view.

Figure 14:
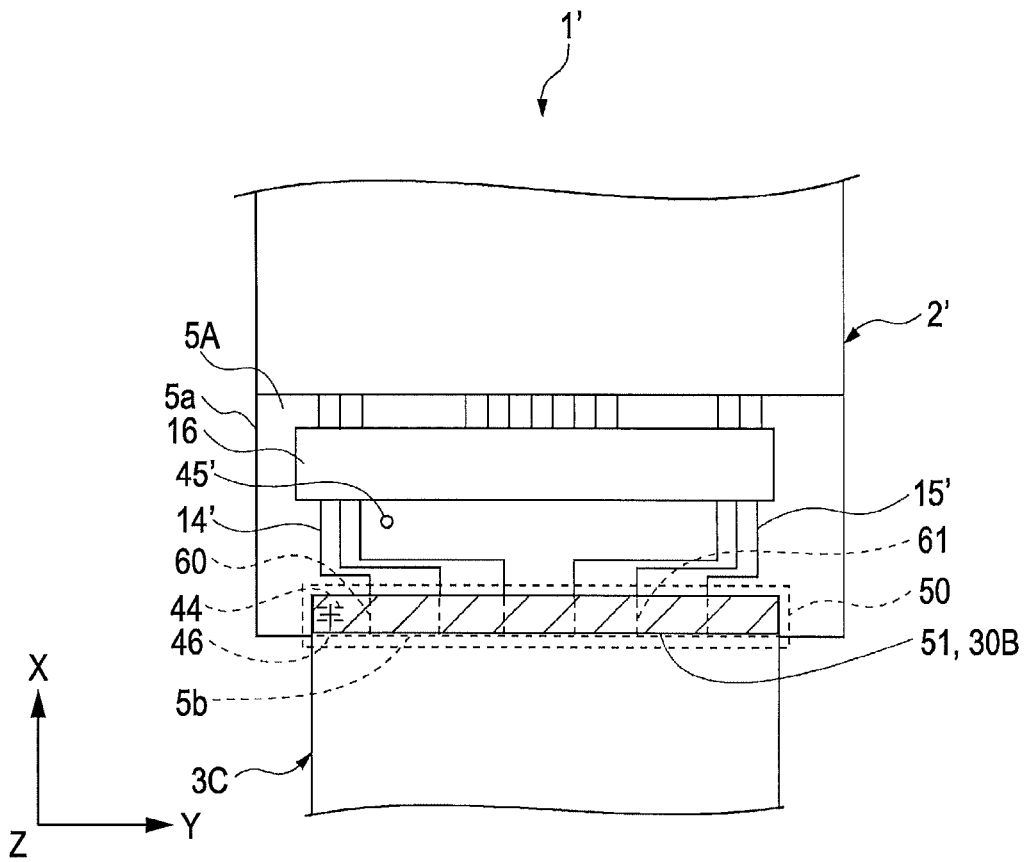
FIG. 14 is a schematic plan view of the state of performing compression bonding between a substrate and a first flexible circuit board according to the second embodiment.

As shown in FIG. 12 and FIG. 13, the connecting terminal portions 60 are arranged on the first face 5A of the substrate 5. As shown in FIG. 12, the connecting terminal portions 60 are connected to the connecting portions 23, which are formed on one face side of the first flexible circuit board 3C, through the ACF 24, or the like. As shown in FIG. 14, the plurality of connecting terminal portions 60 are arranged, and at least one of the plurality of connecting terminal portions 60 is formed of transparent conductive material. In the present embodiment, among the plurality of connecting terminal portions 60, the connecting terminal portion 60 that is arranged on the outermost side of the liquid crystal panel 2' in a direction (Y direction in FIG. 14) that intersects at a right angle with a longitudinal direction (X direction in FIG. 14) of the liquid crystal panel 2' is formed of transparent conductive material.

As shown in FIG. 13, one end portions of the input wirings 15' are respectively connected to driver side input terminals (not shown) of the driver IC 16 through the ACF 24, and connecting terminal portions 61, which are the other end portions of the input wirings 15' and also serve as the first terminals, are connected to a connecting portion, which will be described later, formed on one face side of the first flexible circuit board 3C through the ACF 24, or the like. The connecting terminal portions 61 are portions indicated by the dotted line in FIG. 13.

As shown in FIG. 13, the input wirings 15' and the connecting terminal portions 61, which are the end portions of the input wirings 15', are arranged in a region different from a region that overlaps the heater input terminal portion 30B, which will be described later, in plan view.

As shown in FIG. 14, the first mark 44 and second marks 45' are arranged on the extended portion 5a. The first mark 44 is used for alignment with the first flexible circuit board 3C, which will be described later. The second marks 45' are used for alignment with the second flexible circuit board 3D, which will be described later. The first mark 44 is, for example, four parallel line segments arranged at predetermined intervals. The second marks 45' each have, for example, a circular shape. Note that a plurality of the second marks 45' are formed (not shown). In addition, the shape, number and position to be arranged, or the like, of the first and second marks 44, 45' are not specifically limited.

Furthermore, as shown in FIG. 11 and FIG. 12, the transparent conductive film 30 is, for example, arranged on the second face 5B, which is a rear side (opposite side) of the substrate 5 to the first face 5A so as to overlap the second face 5B in plan view. The transparent conductive film 30 is, for example, formed of transparent conductive material, such as ITO. As shown in FIG. 13, the transparent conductive film 30 includes the heater input terminal portion 30B, which is part of the transparent conductive film 30 and serves as a second terminal, arranged in a second region. In FIG. 13, the heater input terminal portion 30B is indicated by the diagonal line. The heater input terminal portion 30B is a portion to which the end portion of a first heater wiring 41', which will be described later, is compression bonded so as to overlap each other in plan view. As shown in FIG. 13, the heater input terminal portion 30B, which serves as the second terminal, is arranged in a region of the second face 5B of the substrate 5, which is different from (does not overlap) a region opposite the first flexible circuit board 3C. As shown in FIG. 13, the heater input terminal portion 30B, which serves as the second terminal, is arranged in a region different in plan view from the connecting terminal portions 60 and 61.

As shown in FIG. 12, one end portion of the first flexible circuit board 3C is connected to the extended portion 5a through, for example, the ACF 24, and the other end portion is bent and bonded to the reflector plate 32. As shown in FIG. 13, the first flexible circuit board 3C is connected to the substrate 5 near the one side 5b.

As shown in FIG. 13 and FIG. 14, the first flexible circuit board 3C arranged so as to be connected along a direction parallel to the one side 5b of the substrate 5 (in the Y direction in FIG. 13 and in FIG. 14).

As shown in FIG. 12, the connecting portions 23 that are connected to the connecting terminal portions 60, 61 through the ACF 24 are arranged on one face of the first flexible circuit board 3C. These connecting portions 23 are connected to the wirings 34, or the like, provided on one face of the first flexible circuit board 3C.

As shown in FIG. 13, the second flexible circuit board 3D is connected to the second face 5B side of the substrate 5 in a region that is deviated in a direction (X direction in FIG. 13) that intersects at a right angle with a direction (Y direction in FIG. 13) parallel to the one side 5b from a region in which the substrate 5 and the first flexible circuit board 3C are connected. As shown in FIG. 13, the second flexible circuit board 3D is connected to the second face 5B side of the substrate 5 in a region of the second face 5B, which is different from a region that overlaps the connecting terminal portions 60, 61 in plan view.

Figure 16:
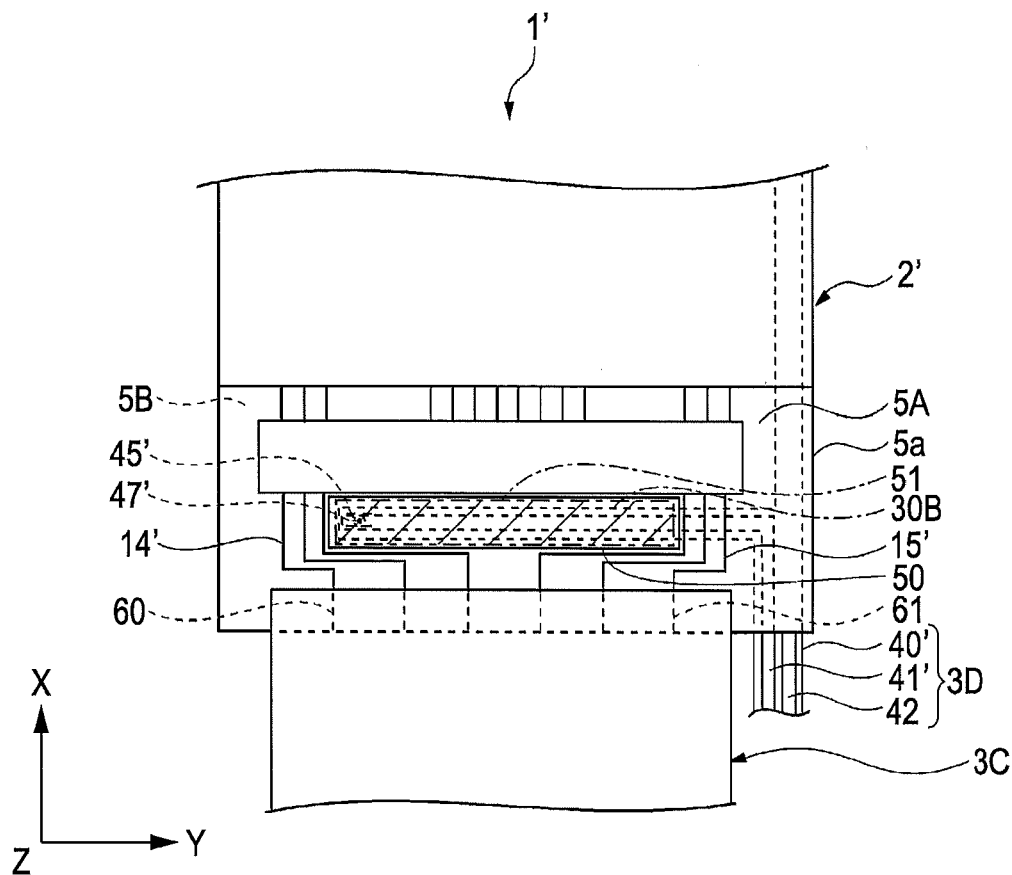
FIG. 16 is a schematic plan view of the state of performing compression bonding between the substrate and a second flexible circuit board according to the second embodiment.

As shown in FIG. 13, the second flexible circuit board 3D includes a resin substrate 40', such as polyimide, for corrosion prevention, the first heater wiring 41' and the second heater wiring 42, which are used for applying voltage to the transparent conductive film 30, and fourth marks 47' (see FIG. 16).

As shown in FIG. 12 and FIG. 13, the first heater wiring 41' is connected to the heater input terminal portion 30B, which serves as the second terminal, through the ACF 24, which is not shown in FIG. 13.

As shown in FIG. 13, the second heater wiring 42 is extended, for example, to an end portion of the substrate 5, opposite to the one side 5b in the longitudinal direction so as to have a portion parallel to the one side 5b, and is connected to the transparent conductive film 30 in a region D through the ACF 24 (not shown). Note that the second heater wiring 42 is, for example, grounded.

As shown in FIG. 16, the fourth marks 47' each have a dot shape. The fourth marks 47' are used for alignment between the substrate 5 and the second flexible circuit board 3D. Note that a plurality of the fourth marks 47' are formed (not shown in the drawing). In addition, the shape, number and position of the fourth marks 47' are not particularly limited.

Method of Manufacturing Liquid Crystal Device

Next, a method of manufacturing the liquid crystal device according to the second embodiment will be described with reference to the accompanying drawings.

Figure 15:
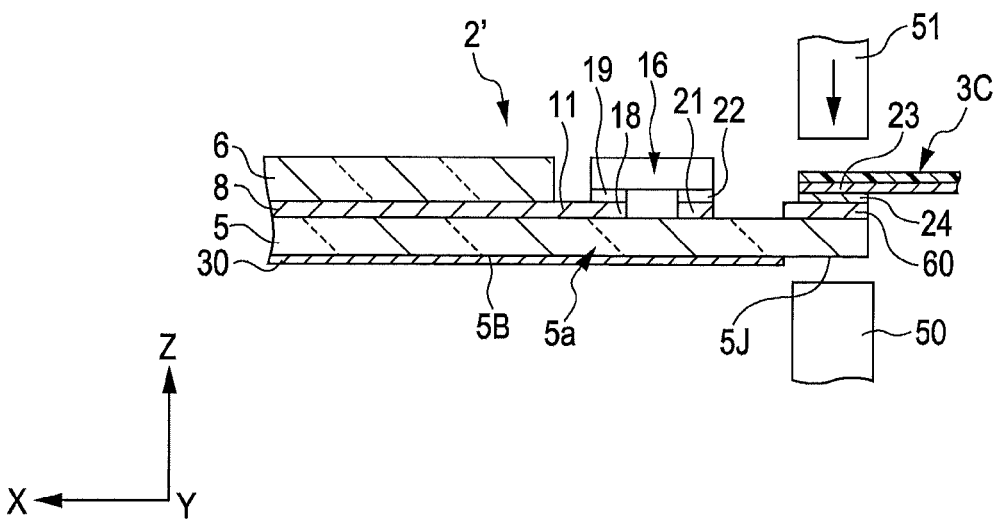
FIG. 15 is a schematic cross-sectional view of the state of performing compression bonding between the substrate and the first flexible circuit board according to the second embodiment.
Figure 17:
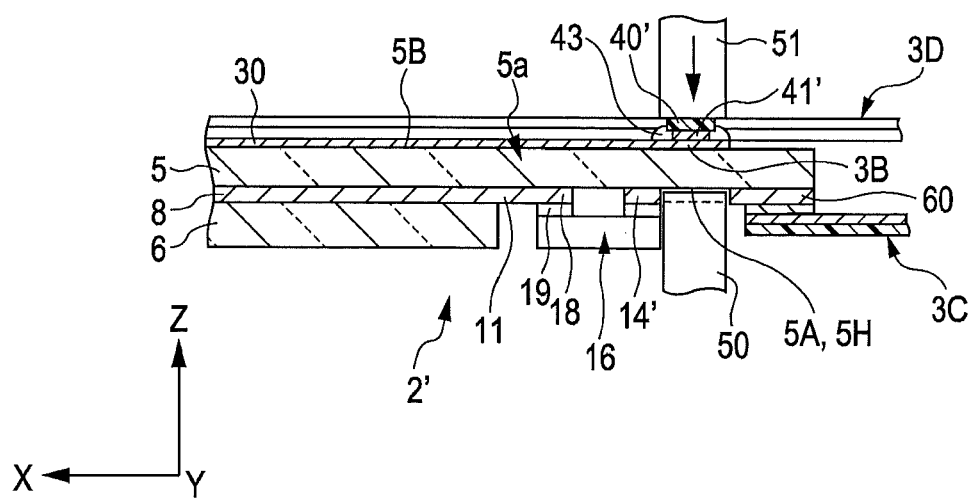
FIG. 17 is a schematic cross-sectional view of the state of performing compression bonding between the substrate and the second flexible circuit board according to the second embodiment.

FIG. 14 is a schematic plan view of the state of performing compression bonding between the substrate 5 and the first flexible circuit board 3C according to the second embodiment. FIG. 15 is a schematic cross-sectional view of the state of performing compression bonding between the substrate 5 and the first flexible circuit board 3C according to the second embodiment. FIG. 16 is a schematic plan view of the state of performing compression bonding between the substrate 5 and the second flexible circuit board 3D according to the second embodiment. FIG. 17 is a schematic cross-sectional view of the state of performing compression bonding between the substrate 5 and the second flexible circuit board 3D according to the second embodiment. Note that, in the present embodiment, the process of extending the input wirings 14', 15' formed on the extended portion 5a of the liquid crystal panel 2', the process of compression bonding the first flexible circuit board 3C and the process of compression bonding the second flexible circuit board 3D will be specifically described.

First, the liquid crystal panel 2' is manufactured. At this time, as shown in FIG. 13, the input wirings 14', 15' provided on the substrate 5 are arranged at least in a region that is different from a region that overlaps the heater input terminal portion 30B in plan view. In addition, as shown in FIG. 14, the first mark 44 and the second marks 45' are formed on the extended portion 5a. Note that a plurality of the second marks 45' are formed (not shown). Furthermore, the transparent conductive film 30 (which partly includes the heater input terminal portion 30B) is formed on the second face 5B side of the substrate 5 using transparent conductive material, such as ITO.

Next, the first flexible circuit board 3C and the second flexible circuit board 3D are manufactured. At this time, the third mark 46 is formed on the first flexible circuit board 3C, as shown in FIG. 14, so as to correspond to the first mark 44, and the fourth marks 47' are formed on the second flexible circuit board 3D so as to correspond to the second marks 45'. Note that a plurality of the fourth marks 47' are formed (not shown in the drawing).

Subsequently, by placing the liquid crystal panel 2' on a stage (not shown), or the like, the first mark 44 and the third mark 46 are aligned by looking through a camera, or the like, as shown in FIG. 14. At this time, for example, by reliably looking positions of the connecting portions 23 of the first flexible circuit board 3C through the transparent substrate 5 and the transparent connecting terminal portion 60, the alignment is accurately performed.

Then, as shown in FIG. 14 and FIG. 15, by vertically moving compression bonding heads 50, 51, the connecting terminal portions 60, 61 arranged on the first face 5A of the substrate 5 and the connecting portions 23 of the first flexible circuit board 3C are thermally compression bonded through the ACF 24. Thus, the region indicated by the diagonal line in FIG. 14 is pressed. At this time, as shown in FIG. 15, for example, there is no component placed between the second face 5B (transparent conductive film 30) of the substrate 5 and the compression bonding head 50, and the second face 5B of the substrate 5 is a smooth face 5J. Thus, the plurality of connecting portions 23 and connecting terminal portions 60, 61 are uniformly pressed. Here, the smooth face 5J is in a state where the second face 5B of the substrate 5 is exposed and in a state where a wiring, a connecting terminal, an electronic component, or the like, is not arranged thereon. In compression bonding or after compression bonding, the smooth face 5J may be in a non-exposed state, for example, by being covered with a protective tape film or an electronic component.

After thermocompression bonding, the degree of flattening of conductive particles of the ACF 24 between the transparent connecting terminal portions 60 and the connecting portions 23, or the like, is observed, for example, through the transparent substrate 5 and the transparent connecting terminal portion 60. In this manner, it is confirmed whether it is in an appropriate compression bonded state on the basis of the degree of flattening of conductive particles, and, when it is inappropriate, it is possible to ensure an appropriate compression bonded state by further pressing, or the like.

After that, the liquid crystal panel 2' is placed, or the like, on a stage (not shown), and, as shown in FIG. 16, the second marks 45' and the fourth marks 47' are aligned by looking through a camera, or the like. Thus, the liquid crystal panel 2' and the second flexible circuit board 3D are aligned.

Next, as shown in FIG. 16 and FIG. 17, by vertically moving compression bonding heads 50, 51, or the like, the heater input terminal portion 30B of the transparent conductive film 30, arranged on the second face 5B of the substrate 5, and the first heater wiring 41' of the second flexible circuit board 3D are thermally compression bonded through the ACF 43. Thus, the region indicated by the diagonal line in FIG. 16 is pressed. At this time, as shown in FIG. 17, the substrate 5 side and the first flexible circuit board 3C have been already compression bonded; however, for example, there is no component placed between the first face 5A of the substrate 5 and the compression bonding head 50, and the first face 5A of the substrate 5 is the smooth face 5H. Thus, the first heater wiring 41' and the heater input terminal portion 30B are uniformly pressed through conductive particles (not shown).

After thermocompression bonding, the degree of flattening of conductive particles of the ACF 43 between the heater input terminal portions 30B and the first heater wiring 41', or the like, is observed, for example, through the transparent substrate 5 and the transparent heater input terminal portion 30B. In this manner, it is confirmed whether it is in an appropriate compression bonded state on the basis of the degree of flattening of conductive particles, and, when it is inappropriate, it is possible to ensure an appropriate compression bonded state by further pressing, or the like.

Next, the frame 4, the light guide plate 31, and the like, are fixed to the liquid crystal panel 2', and the first flexible circuit board 3C is bent in a substantially U-shape and then, for example, fixed to the reflector plate 32 side, or the like, to thereby manufacture the liquid crystal device 1'.

With that, the description of the method of manufacturing the liquid crystal device 1' ends.

According to the present embodiment, the substrate 5 has the one side 5b that overlaps the first flexible circuit board 3C in plan view, and the first flexible circuit board 3C is connected to the first face 5A side of the substrate 5 near the one side 5b. Then, the second flexible circuit board 3D is connected to the second face 5B side of the substrate 5 in a region that is deviated in a direction (X direction in FIG. 13) that intersects at a right angle with the one side 5b from a region in which the substrate 5 and the first flexible circuit board 3C are connected. Thus, in order to connect the first flexible circuit board 3C to, for example, near the one side 5b of the substrate 5, as shown in FIG. 15, when the first flexible circuit board 3C is compression bonded to the substrate 5, it is possible to perform compression bonding using the smooth face 5J by the compression bonding head 50 without placing the heater input terminal portion 30B and the first heater wiring 41' between the substrate 5 and the first flexible circuit board 3C. Accordingly, it is possible to press the first flexible circuit board 3C with a uniform force using the compression bonding head 51. Thus, it is possible to connect the connecting terminal portions 60, 61, formed on the first face 5A side of the substrate 5, and the connecting portions 23 of the first flexible circuit board 3C without deteriorating connection reliability.

In addition, after that, in order to compression bond the second flexible circuit board 3D, when the second flexible circuit board 3D is compression bonded to the substrate 5, even when the substrate 5 and the first flexible circuit board 3C have been already compression bonded, it is possible to perform compression bonding using the smooth face 5H by the compression bonding head 50 without placing the connecting terminal portions 60, 61, or the like, between the compression bonding head 50 and the substrate 5. Accordingly, it is possible to press the second flexible circuit board 3D with a uniform force using the compression bonding head 51. Thus, it is possible to connect the heater input terminal portion 30B, formed on the second face 5B side of the substrate 5, and the first heater wiring 41' of the second flexible circuit board 3D without deteriorating connection reliability.

Furthermore, the input wirings 14', 15' connected to the connecting terminal portions 60, 61 are extended to a region different from a region that overlaps the heater input terminal portion 30B in plan view, as shown in FIG. 13. In this manner, for example, when the substrate 5 and the second flexible circuit board 3D are compression bonded after the substrate 5 and the first flexible circuit board 3B have been compression bonded, as shown in FIG. 17, only the substrate 5, the heater input terminal portion 30B and the second flexible circuit board 3D are placed between the compression bonding head 50 and the compression bonding head 51, so that it is possible to prevent the input wirings 15', or the like, from being placed between the compression bonding heads 50, 51. The heater input terminal portion 30B cannot be pressed uniformly if the input wirings 14', 15', or the like, are placed between the compression bonding heads 50, 51. In contrast, the second flexible circuit board 3D may be pressed uniformly against the heater input terminal portion 30B. As a result, without any influence of the input wirings 14', 15', and the like, it is possible to improve reliability of connection between the heater input terminal portion 30B, arranged on the substrate 5, and the first heater wiring 41' of the second flexible circuit board 3D.

In addition, the substrate 5 is transparent, and at least one of the plurality of connecting terminal portions 60 has a transparent portion. For example, at least one of the plurality of connecting terminal portions 60 is formed of transparent conductive material. In this manner, for example, after the first flexible circuit board 3C has been compression bonded to the substrate 5 through the ACF 24, it is possible to easily observe the state of conductive particles through the transparent substrate 5 and the transparent connecting terminal portion 60. Thus, by appropriately adjusting, for example, the compression bonding between the substrate 5 and the first flexible circuit board 3C on the basis of the observation result, it is possible to improve reliability of connection between the connecting terminal portions 60 and the connecting portions 23 of the first flexible circuit board 3C. In addition, by looking, for example, the connecting portions 23 of the first flexible circuit board 3C through the transparent substrate 5 and the transparent connecting terminal portion 60, it is possible to accurately perform alignment of the first flexible circuit board 3C to the substrate 5 before compression bonding.

Furthermore, the first mark 44 that is used for alignment with the first flexible circuit board 3C and the second marks 45' that are used for alignment with the second flexible circuit board 3D are formed on the substrate 5. In addition, the third mark 46 that is used for alignment with the substrate 5 is formed on the first flexible circuit board 3C so as to correspond to the first mark 44. Furthermore, the fourth marks 47' that are used for alignment with the substrate 5 are formed on the second flexible circuit board 3D so as to correspond to the second marks 45'. Thus, by using the first mark 44 and the third mark 46, it is possible to perform alignment between the substrate 5 and the first flexible circuit board 3C, and, by using the second marks 45' and the fourth marks 47', it is possible to perform alignment between the substrate 5 and the second flexible circuit board 3D. At this time, because the first mark 44 corresponds to the third mark 46, and the second marks 45' correspond to the fourth marks 47', it is possible to reliably, accurately and easily perform alignment between the substrate 5 and the first flexible circuit board 3C and alignment between the substrate 5 and the second flexible circuit board 3D.

Third Embodiment

Next, a third embodiment according to the invention will be described with reference to FIG. 18 to FIG. 22B. Note that the same reference numerals are assigned to the same components in the following embodiments as those of the first embodiment and the second embodiment, and the description thereof is omitted. The different portions will be particularly described. In addition, in regard to a method of manufacturing the liquid crystal device as well, the portions different from those of the first embodiment and the second embodiment will be particularly described.

The liquid crystal device according to the third embodiment differs from the liquid crystal device according to the first embodiment and the second embodiment in that a touch panel is provided as an input device.

Figure 18:
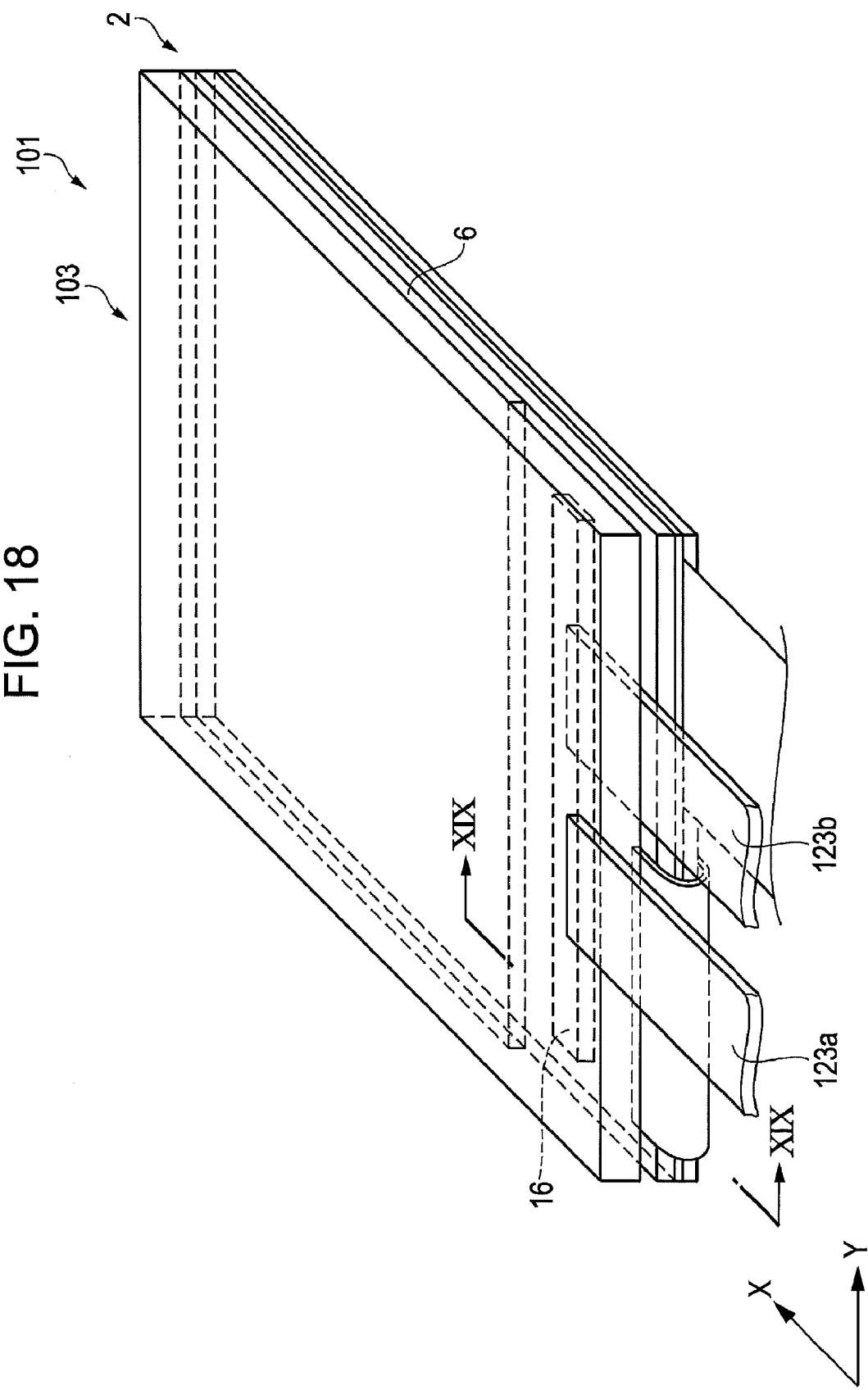
FIG. 18 is a schematic perspective view of a liquid crystal device that is provided with a touch panel according to a third embodiment of the invention.
Figure 19:
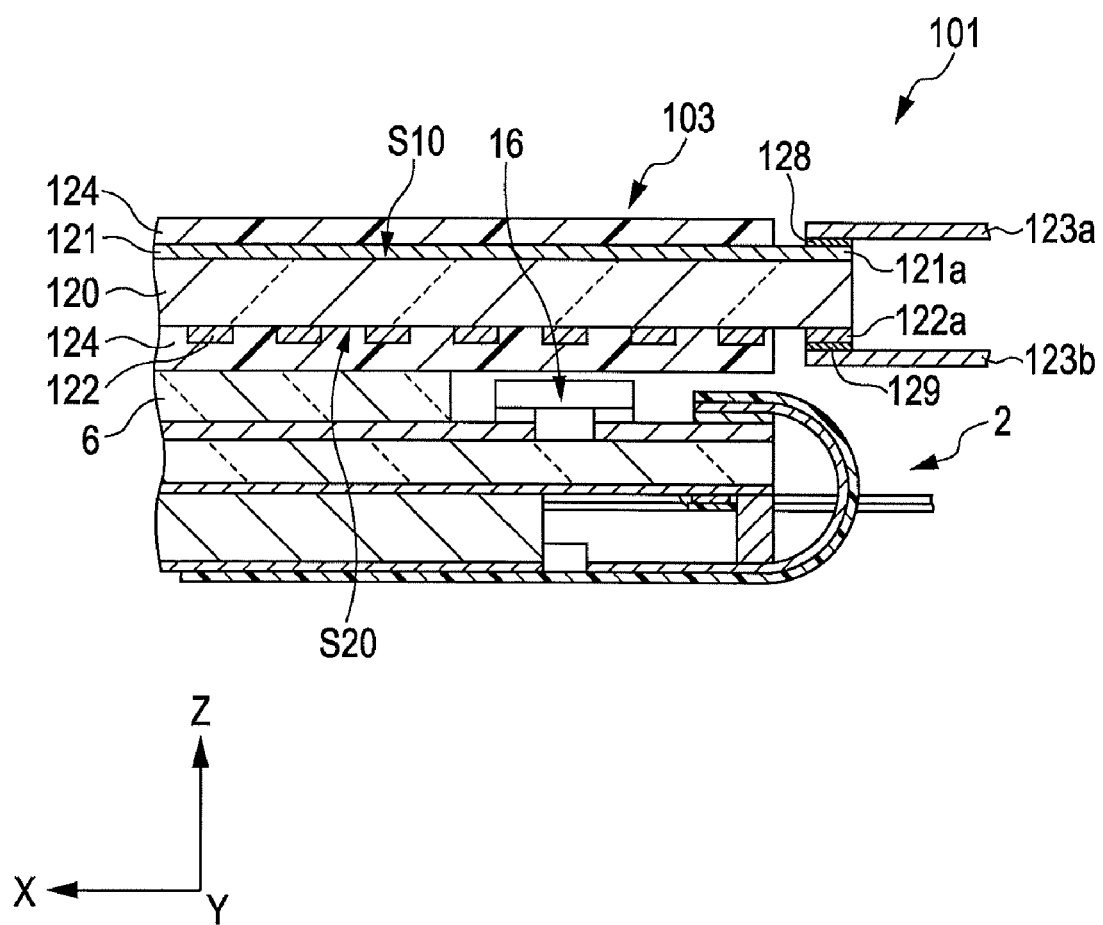
FIG. 19 is a cross-sectional view of the liquid crystal device, taken along the line XIX-XIX in FIG. 18.
Figure 21:
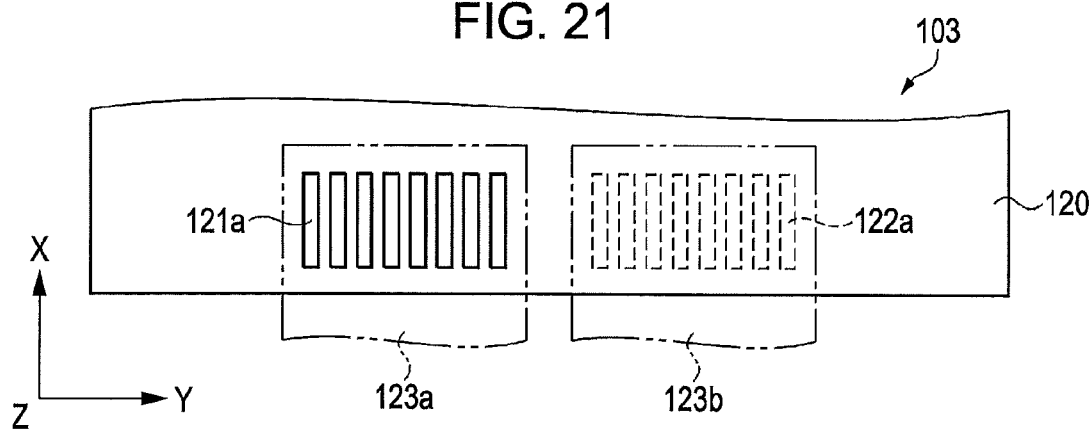
FIG. 21 is a schematic terminal arrangement diagram of connecting terminal portions formed in the touch panel according to the third embodiment.

FIG. 18 is a schematic perspective view of a liquid crystal device that is provided with a touch panel according to the third embodiment. FIG. 19 is a cross-sectional view of the liquid crystal device, taken along the line XIX-XIX in FIG. 18. FIG. 20A and FIG. 20B are schematic wiring diagrams of the touch panel according to the third embodiment. FIG. 21 is a schematic terminal arrangement diagram of connecting terminal portions formed in the touch panel according to the third embodiment.

Configuration of Liquid Crystal Device

In FIG. 18, a liquid crystal device 101 includes the liquid crystal panel 2, which serves as an electro-optical panel, and a touch panel 103, which serves as an input device. As in the case of the above described embodiments, the liquid crystal panel 2 may be provided with other additional mechanisms, such as a frame that supports the liquid crystal panel 2, where appropriate.

As shown in FIG. 18 and FIG. 19, the touch panel 103 is arranged on the substrate 6 of the liquid crystal panel 2. In this case, the touch panel 103 is adhered to the substrate 6 through an adhesive, or the like. An example of the adhesive may be a PSA (Pressure Sensitive Adhesive) that hardens by, for example, applying pressure in a room temperature atmosphere.

As shown in FIG. 19, the touch panel 103 includes a translucent substrate 120, a first flexible circuit board 123a, a second flexible circuit board 123b and a resin film 124. The translucent substrate 120 is a plate-like member that is, for example, formed of translucent material, such as glass or synthetic resin. The first flexible circuit board 123a is arranged on a first face (a face on an opposite side to the liquid crystal panel 2) S10 of the translucent substrate 120. The second flexible circuit board 123b is arranged on a second face (a face on a side on which the liquid crystal panel 2 is provided, or a rear face relative to the first face) S20 of the translucent substrate 120.

As shown in FIG. 20A and FIG. 20B, the touch panel 103 is provided with a plurality of first electrodes 121, a plurality of second electrodes 122, a plurality of first connecting terminal portions 121a, which serve as first terminals, and a plurality of second connecting terminal portions 122a, which serve as second terminals. These first electrodes 121, second electrodes 122, first connecting terminal portions 121a and second connecting terminal portions 122a are, for example, formed of transparent conductive material, such as ITO.

As shown in FIG. 20A, the first electrodes 121 and the first connecting terminal portions 121a are arranged on the first face S10 of the translucent substrate 120. The first electrodes 121 and the corresponding first connecting terminal portions 121a are electrically connected to each other through, for example, wirings indicated by the solid line. Then, the plurality of first electrodes 121 is formed in the X direction. The plurality of first connecting terminal portions 121a are formed so as to be arranged in the X direction along one side among four sides that define the first face S10 of the translucent substrate 120, and located in a first region. The first electrodes 121, and the like, are formed on the first face S10 of the translucent substrate 120 in order to form a display input portion. The first terminals are electrically connected to the display input portion. As shown in FIG. 20B, the second electrodes 122 and the second connecting terminal portions 122a are arranged on the second face S20 of the translucent substrate 120. The second electrodes 122 and the corresponding second connecting terminal portions 122a are electrically connected to each other through, for example, wirings indicated by the solid line. Then, the plurality of second electrodes 122 are formed in the Y direction. The plurality of second connecting terminal portions 122a are formed so as to be arranged in the X direction along one side among four sides that define the second face S20 of the translucent substrate 120, and located in a second region. Thus, the first connecting terminal portions 121a and the second connecting terminal portions 122a are arranged respectively in the first region and the second region, and are formed in the regions that do not overlap each other as viewed in plan in a Z direction.

As shown in FIG. 21, one end of the first flexible circuit board 123a is electrically connected through the first connecting terminal portions 121a to the first electrodes 121. Then, one end of the second flexible circuit board 123b is electrically connected through the second connecting terminal portions 122a to the second electrodes 122. The other ends of these first and second flexible circuit boards 123a, 123b are connected to an external control circuit, such as, for example, a position detection circuit, or the like, and signals are input or output between the control circuit and the first electrodes 121 and between the control circuit and the second electrodes 122.

As shown in FIG. 19, the resin film 124 is provided as a protection layer on the first face S10 of the translucent substrate 120 so as to cover the plurality of first electrodes 121. Then, the resin film 124 is provided as a protection layer on the second face S20 of the translucent substrate 120 so as to cover the plurality of second electrodes 122. These resin films 124 may be formed of translucent photosensitive resin, such as acrylic resin. The resin film 124 formed on the second face S20 of the translucent substrate 120 is adhered on the substrate 6 of the liquid crystal panel 2 by an adhesive, or the like. Here, in the present embodiment, the resin film 124 is not only formed on the first face S10 of the translucent substrate 120 but also on the second face S20 of the translucent substrate 120; however, the resin film 124 may be provided only on any one of the first face S10 and the second face S20 instead.

In addition, for example, a protection plate and a frame pattern may be formed on the resin film 124 that is formed on the first face S10 side of the translucent substrate 120. In this case, the protection plate is, for example, formed of translucent resin, such as PMMA (polymethylmethacyrlate) or polycarbonate. Using the above protection plate, the first face S10 of the translucent substrate 120 and the plurality of first electrodes 121 are protected. An example of an adhesive may be, for example, the above described PSA.

The frame pattern is formed in a frame shape as viewed in the Z direction. The frame pattern is formed in a peripheral region of both the protection plate and the first face S10 of the touch panel 103, and is, for example, used as a frame that defines a display area of the liquid crystal device 101. In addition, the frame pattern has a light blocking property, and is used as a light blocking frame that blocks light from leaking through an area other than the display area of the liquid crystal device 101. Then, the frame pattern is provided using, for example, deep color pigment or dye, such as black color, through various methods, such as application, printing, or vapor deposition.

Method of Manufacturing Liquid Crystal Device

Figure 22A:
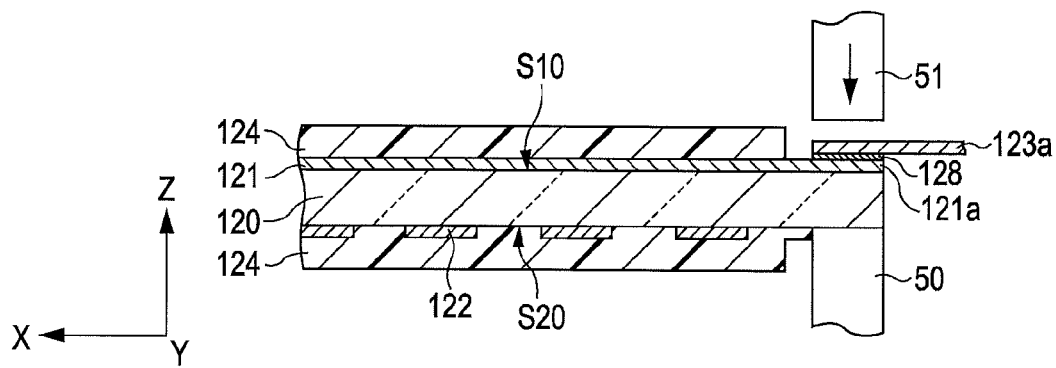
FIG. 22A and FIG. 22B are schematic cross-sectional views of the state of performing compression bonding between a translucent substrate and first and second flexible circuit boards.
Figure 22B:
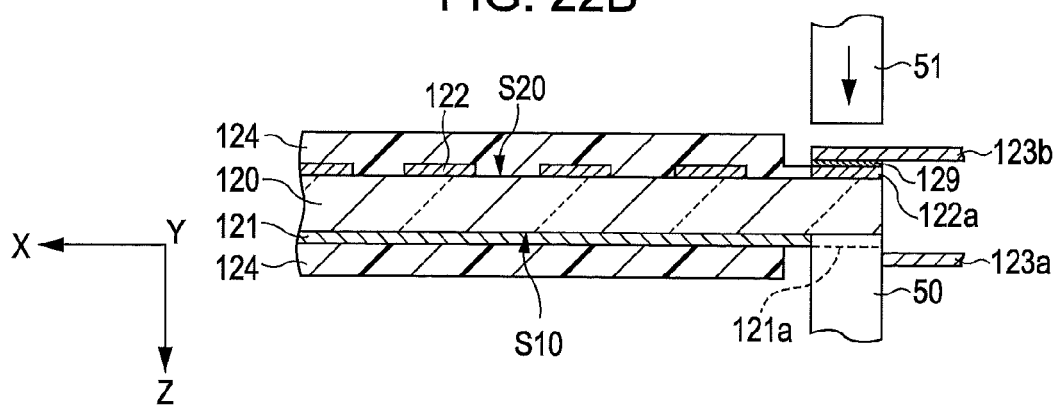

Hereinafter, a method of manufacturing the liquid crystal device according to the third embodiment will be described with reference to FIG. 22A and FIG. 22B, focusing on the portions different from those of the first and second embodiments. FIG. 22A and FIG. 22B are schematic cross-sectional views of the state of performing compression bonding between the translucent substrate and the first flexible circuit board and between the translucent substrate and the second flexible circuit board in the touch panel of the liquid crystal device according to the third embodiment.

As shown in FIG. 22A, by vertically moving the compression bonding heads 50, 51, the first connecting terminal portions 121a that are arranged on the first face S10 of the translucent substrate 120 and the connecting portions that are provided at one end of the first flexible circuit board 123a are thermally compression bonded through an ACF 128. At this time, there is no component placed between both the first face S10 of the translucent substrate 120 and the first connecting terminal portions 121a and the compression bonding head 51, and the first face S10 of the translucent substrate 120 has an exposed smooth face. Thus, the first flexible circuit board 123a and the first connecting terminal portions 121a are uniformly pressed. Here, the smooth face is in a state where the second face 5B of the substrate 5 is exposed and in a state where a wiring, a connecting terminal, an electronic component, or the like, is not arranged thereon. In compression bonding or after compression bonding, the smooth face may be in a non-exposed state, for example, by being covered with a protective tape film or an electronic component.

As shown in FIG. 22B, by vertically moving the compression bonding heads 50, 51, the second connecting terminal portions 122a that are arranged on the second face S20 of the translucent substrate 120 and the connecting portions provided at one end of the second flexible circuit board 123b are thermally compression bonded through an ACF 129. At this time, there is no component placed between the second face S20 of the translucent substrate 120 and the compression bonding head 51, and the second face S20 of the translucent substrate 120 has an exposed smooth face. Thus, the second flexible circuit board 123b and the second connecting terminal portions 122a are uniformly pressed.

Note that the compression bonding heads 50, 51 respectively have smooth faces that press both the first flexible circuit board 123a and the first connecting terminal portions 121a or both the second flexible circuit board 123b and the second connecting terminal portions 122a.

After thermocompression bonding, the degree of flattening of conductive particles of the ACFs 128, 129 between the first connecting terminal portions 121a or the second connecting terminal portions 122a and the connecting portions provided at one ends of the first and second flexible circuit boards 123a, 123b, or the like, is observed, for example, through the transparent translucent substrate 120, the transparent first connecting terminal portions 121a, and the transparent second connecting terminal portions 122a. In this manner, it is confirmed whether it is in an appropriate compression bonded state on the basis of the degree of flattening of conductive particles, and, when it is inappropriate, it is possible to ensure an appropriate compression bonded state by further pressing, or the like. In addition, in order to reduce or adjust a wiring resistance, or the like, the connecting terminal portions 121a, 122a may be formed by laminating a light shielding conductive material on a transparent conductive material. The light shielding conductive material may include chromium, aluminum, molybdenum, tungsten, and an alloy containing at least one of these materials.

According to the present embodiment as described above, the first connecting terminal portions 121a that are arranged on the first face S10 of the translucent substrate 120 and the second connecting terminal portions 122a that are arranged in a region that does not overlap a region of the second face S20, opposite the first flexible circuit board 123a, are provided, and the smooth face is provided in a region of the second face S20 of the translucent substrate 120, which overlaps the first flexible circuit board 123a in plan view. In this manner, when the first connecting terminal portions 121a and the first flexible circuit board 123a are compression bonded and connected, the first connecting terminal portions 121a and one end of the first flexible circuit board 123a is not placed between the compression bonding head 50 and the compression bonding head 51, and it is possible to perform compression bonding using the smooth face by the compression bonding head 50. Thus, it is possible to press the translucent substrate 120 and the first flexible circuit board 123a with a uniform force, and it is possible to improve reliability of connection, on the first face S10 side of the translucent substrate 120, between the first connecting terminal portions 121a and the first flexible circuit board 123a. In addition, the same advantageous effects as those in the above described embodiments may be obtained.

Alternative Embodiments

FIG. 23A to FIG. 23C are schematic terminal arrangement diagrams that show alternative embodiments in terms of arrangement of the connecting terminal portions. As shown in FIG. 23A, in comparison with the arrangement of the connecting terminal portions according to the third embodiment, the interval between the first connecting terminal portions 121a and the second connecting terminal portions 122a are reduced in one direction, for example, in the Y direction. In this case as well, as shown in the drawing, the first connecting terminal portions 121a and the second connecting terminal portions 122a are formed respectively in regions that do not overlap each other as viewed in plan in the Z direction. In regard to the Y direction, the widths of the connecting terminal portions 121a, 122a and the pitch of the connecting terminal portions 121a, 122a may be narrow or wide.

Next, as shown in FIG. 23B, the first connecting terminal portions 121a and the second connecting terminal portions 122a are arranged offset in the X direction from each other in comparison with the arrangement of the connecting terminal portions according to the third embodiment. In this case as well, as shown in the drawing, the first connecting terminal portions 121a and the second connecting terminal portions 122a are formed respectively in regions that do not overlap each other as viewed in plan in the Z direction. Moreover, as shown in FIG. 23C, the first connecting terminal portions 121a and the second connecting terminal portions 122a are arranged offset both in the X direction and in the Y direction from each other in comparison with the arrangement of the connecting terminal portions according to the third embodiment. Then, the first flexible circuit board 123a and the second flexible circuit board 123b are arranged so as to partially overlap each other as viewed in plan in the Z direction. In this case as well, as shown in the drawing, the first connecting terminal portions 121a and the second connecting terminal portions 122a are formed respectively in regions that do not overlap each other as viewed in plan in the Z direction. In addition, in comparison with the alternative embodiment shown in FIG. 23B, the first and second flexible circuit boards 123a, 123b indicated by the alternate long and two short dashes line are arranged respectively in regions that partially overlap each other as viewed in plan in the Z direction. The first connecting terminal portions 121a and the second connecting terminal portions 122a are arranged respectively in a first region and in a second region, and are formed in regions that do not overlap each other as viewed in plan in the Z direction.

According to the above, with the arrangements of the connecting terminal portions shown in FIG. 23A to FIG. 23C as well, the same advantageous effects as described above may be obtained.

It is possible to thermally compression bond the first connecting terminal portions 121a and the second connecting terminal portions 122a, which are arranged on the translucent substrate 120 according to the manner of arrangement of the connecting terminal portions shown in FIG. 23A, with the first and second flexible circuit boards, as in the case shown in FIG. 22A and FIG. 22B. In addition, the same advantageous effects as those in the above described embodiments may be obtained.

It is possible to thermally compression bond the first connecting terminal portions 121a and the second connecting terminal portions 122a, which are arranged on the translucent substrate 120 according to the arrangement of the connecting terminal portions shown in FIG. 23B and FIG. 23C, with the first and second flexible circuit boards, as in the following fourth embodiment.

Fourth Embodiment

Hereinafter, a fourth embodiment according to the invention will be described with reference to FIG. 23B, FIG. 24A and FIG. 24B. Note that the same reference numerals are assigned to the same components described in the following embodiments as those of the first to third embodiments, and the description thereof is omitted. The different portions will be particularly described. In addition, in regard to a method of manufacturing the liquid crystal device as well, the portions different from those of the first to third embodiments will be particularly described.

The liquid crystal device according to the fourth embodiment differs from the liquid crystal device according to the first and second embodiments in that a touch panel is provided as an input device as in the case of the third embodiment. In addition, the liquid crystal device according to the fourth embodiment differs from the liquid crystal device and its manufacturing method according to the third embodiment in the manner of arrangement of the connecting terminal portions formed in the touch panel and also in the manner of connection between the connecting terminal portions and the first and second flexible circuit boards. FIG. 23A and FIG. 23B are schematic terminal arrangement diagrams that show arrangements of the connecting terminal portions formed in the touch panel according to the fourth embodiment.

Method of Manufacturing Liquid Crystal Device

Next, a method of manufacturing the liquid crystal device provided with a touch panel according to the fourth embodiment will be described with reference to FIG. 24A and FIG. 24B.

Figure 24A:
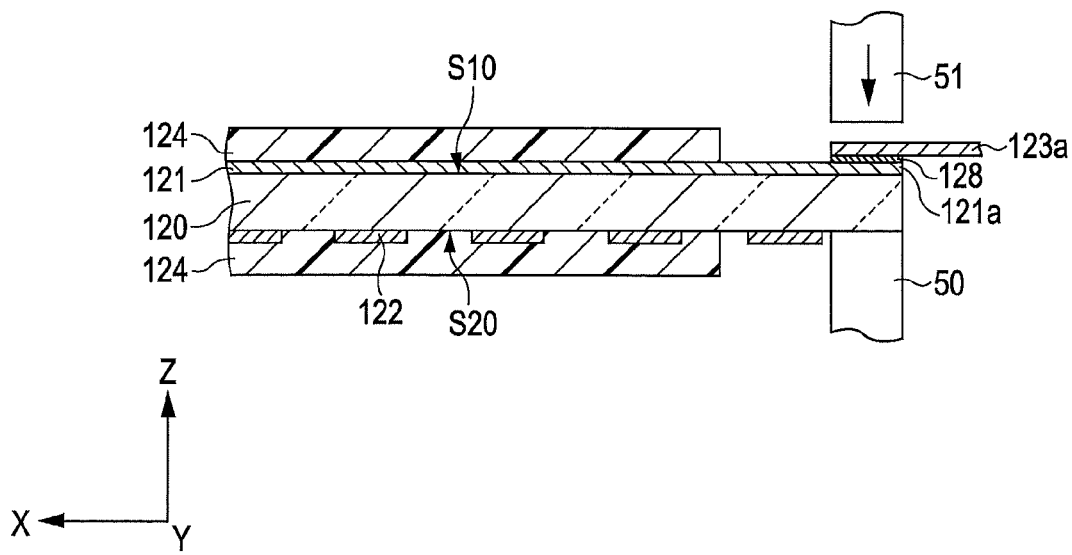
FIG. 24A and FIG. 24B are schematic cross-sectional views of the state of performing compression bonding between a translucent substrate and first and second flexible circuit boards.
Figure 24B:
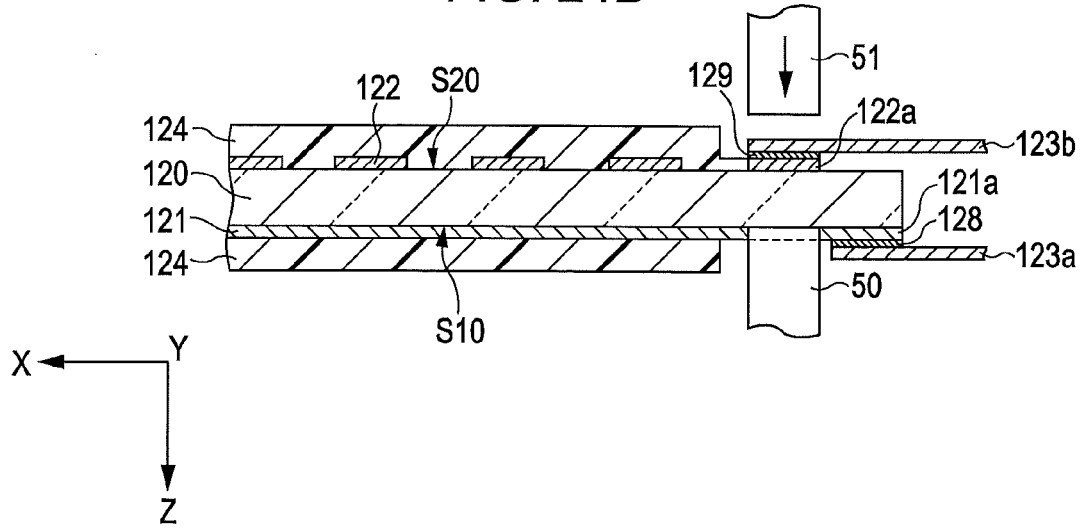

FIG. 24A and FIG. 24B are schematic cross-sectional views of the state of performing compression bonding between the translucent substrate of the touch panel and the first and second flexible circuit boards.

As shown in FIG. 24A, by vertically moving the compression bonding heads 50, 51, the first connecting terminal portions 121a that are arranged on the first face S10 of the translucent substrate 120 and the connecting portions that are provided at one end of the first flexible circuit board 123a are thermally compression bonded through the ACF 128. At this time, there is no component placed between both the first face S10 of the translucent substrate 120 and the first connecting terminal portions 121a and the compression bonding head 51, and the first face S10 of the translucent substrate 120 has an exposed smooth face. Thus, the first flexible circuit board 123a and the first connecting terminal portions 121a are uniformly pressed.

As shown in FIG. 24B, by vertically moving the compression bonding heads 50, 51, the second connecting terminal portions 122a that are arranged on the second face S20 of the translucent substrate 120 and the connecting portions provided at one end of the second flexible circuit board 123b are thermally compression bonded through the ACF 129. At this time, there is no component placed between the second face S20 of the translucent substrate 120 and the compression bonding head 51, and the second face S20 of the translucent substrate 120 has an exposed smooth face. Thus, the second flexible circuit board 123b and the second connecting terminal portions 122a are uniformly pressed.

Note that the compression bonding heads 50, 51 respectively have smooth faces that are used to press both the first flexible circuit board 123a and the first connecting terminal portions 121a or both the second flexible circuit board 123b and the second connecting terminal portions 122a.

After thermocompression bonding, the degree of flattening of conductive particles of the ACFs 128, 129 between the first connecting terminal portions 121a or the second connecting terminal portions 122a and the connecting portions provided at one ends of the first and second flexible circuit boards 123a, 123b, or the like, is observed, for example, through the transparent translucent substrate 120, the transparent first connecting terminal portions 121a, and the transparent second connecting terminal portions 122a. In this manner, it is confirmed whether it is in an appropriate compression bonded state on the basis of the degree of flattening of conductive particles, and, when it is inappropriate, it is possible to ensure an appropriate compression bonded state by further pressing, or the like. In addition, in order to reduce or adjust a wiring resistance, or the like, the connecting terminal portions 121a, 122a may be formed by laminating a light shielding conductive material on a transparent conductive material. The light shielding conductive material may include chromium, aluminum, molybdenum, tungsten, and an alloy containing at least one of these materials.

According to the present embodiment as described above, the first connecting terminal portions 121a that are arranged on the first face S10 of the translucent substrate 120 and the second connecting terminal portions 122a that are arranged in a region that does not overlap a region of the second face S20, opposite the first flexible circuit board 123a, are provided, and the smooth face is provided in a region of the second face S20 of the translucent substrate 120, which overlaps the first flexible circuit board 123a in plan view. In this manner, when the first connecting terminal portions 121a and the first flexible circuit board 123a are compression bonded and connected, the first connecting terminal portions 121a and one end of the first flexible circuit board 123a is not placed between the compression bonding head 50 and the compression bonding head 51, and it is possible to perform compression bonding using the smooth face by the compression bonding head 50. Thus, it is possible to press the translucent substrate 120 and the first flexible circuit board 123a with a uniform force, and it is possible to improve reliability of connection, on the first face S10 side of the translucent substrate 120, between the first connecting terminal portions 121a and the first flexible circuit board 123a. In addition, the same advantageous effects as those in the above described embodiments may be obtained.

Furthermore, with the arrangement of the connecting terminal portions shown in FIG. 23C as well, the same advantageous effects as those in the fourth embodiment may be obtained.

Alternative Embodiment

Figure 25A:
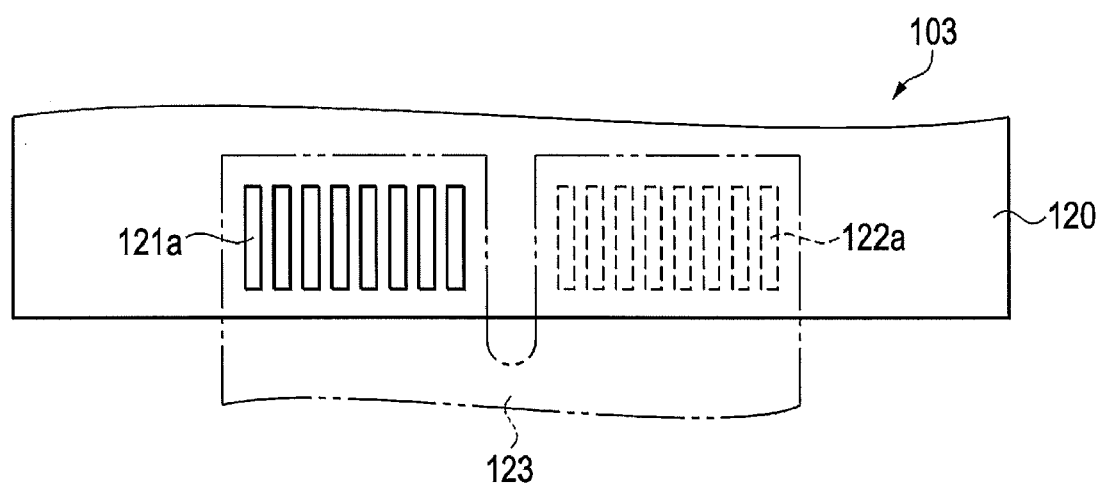
FIG. 25A and FIG. 25B are schematic views that show an alternative embodiment of the first flexible circuit board.
Figure 25B:
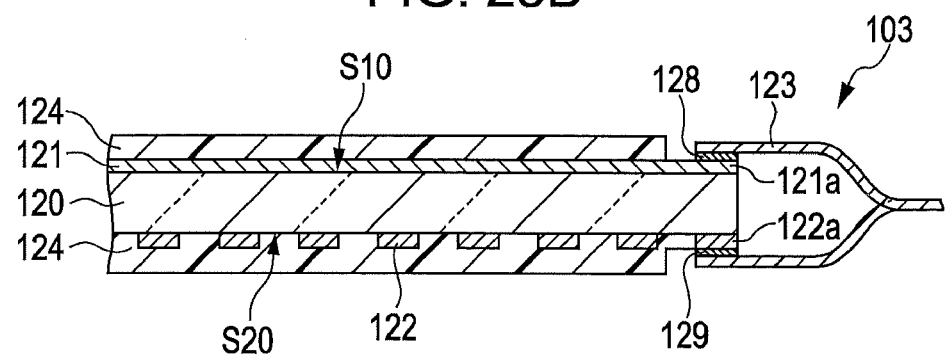

FIG. 25A and FIG. 25B are schematic views that show an alternative embodiment of the first flexible circuit board. As shown in FIG. 25A and FIG. 25B, one end of the first flexible circuit board 123 is connected to both the first connecting terminal portions 121a that are arranged on the first face S10 of the translucent substrate 120 and the second connecting terminal portions 122a that are arranged on the second face S20 of the translucent substrate 120.

It is possible to thermally compression bond the first flexible circuit board to the touch panel according to the arrangement of the connecting terminal portions shown in FIG. 25A and FIG. 25B, as in the case shown in FIG. 22A and FIG. 22B. In addition, the same advantageous effects as those in the above described embodiments may be obtained.

The arrangement of the first connecting terminal portions 121a and the second connecting terminal portions 122a is not limited to the arrangement shown in FIG. 25A, but it may be the arrangements shown in FIG. 23A to FIG. 23C. When the connecting terminal portions are arranged as shown in FIG. 23C, it is possible to perform thermocompression bonding as in the case shown in FIG. 22A and FIG. 22B. When the connecting terminal portions are arranged as shown in FIG. 23A or FIG. 23B, it is possible to perform thermocompression bonding as in the case shown in FIG. 24A and FIG. 24B.

In addition, in the above described embodiments and alternative embodiments, one translucent substrate 120 is used to form the touch panel only; however, two translucent substrates may be adhered and used to form the touch panel. It is applicable that, owing to this configuration, both the first connecting terminal portions 121a and the second connecting terminal portions 122a are formed on the first face S10 side of the touch panel. Thus, when the first and second flexible circuit boards are respectively connected to the first connecting terminal portions 121a and the second connecting terminal portions 122a, they may be compression bonded from the first face S10 side of the touch panel. In other words, this alternative embodiment differs from the above described embodiments and alternative embodiments in that the first and second flexible circuit boards are compression bonded only to the first face S10 side of the touch panel. For example, the first electrodes 121 and the first connecting terminal portions 121a are formed on the first face of a first substrate, and the second electrodes 122 and the second connecting terminal portions 122a are formed on the first face of a second substrate. Then, the first face of the first substrate and the second face of the second substrate, which is a rear face relative to a first face of the second substrate, are adhered to each other. The thus configured touch panel is, for example, formed so that the first substrate is arranged between the first electrodes 121, shown in FIG. 19 or in FIG. 25A and FIG. 25B, and the resin film 124. In this case, the translucent substrate 120 corresponds to the second substrate. Then, the first substrate has an extended portion, which is a region extending beyond the outer periphery of the second substrate. The connecting terminal portions 121a are provided on the first face of the extended portion, and are electrically connected to the first electrodes 121. In this manner, both the first connecting terminal portions 121a and the second connecting terminal portions 122a are formed on the first face S10 side of the touch panel. Alternatively, the first electrodes 121, the second electrodes 122, the first connecting terminal portions 121a and the second connecting terminal portions 122a may be formed not on the first face S10 side but on the second face S20 side, and then both the first and second flexible circuit boards may be compression bonded.

In addition, in the above described embodiments and alternative embodiments, for example, a driver IC that drives the touch panel may be mounted on the translucent substrate 120 that constitutes the touch panel.

Fifth Embodiment—Electronic Apparatuses

Next, electronic apparatuses provided with the above described liquid crystal device will be described.

Figure 26:
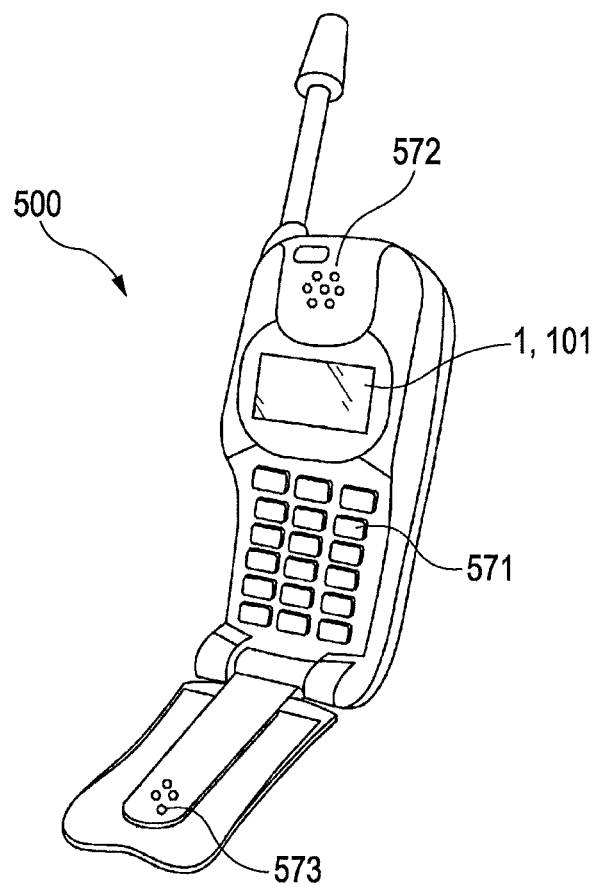
FIG. 26 is a schematic external view of a cellular phone.
Figure 27:
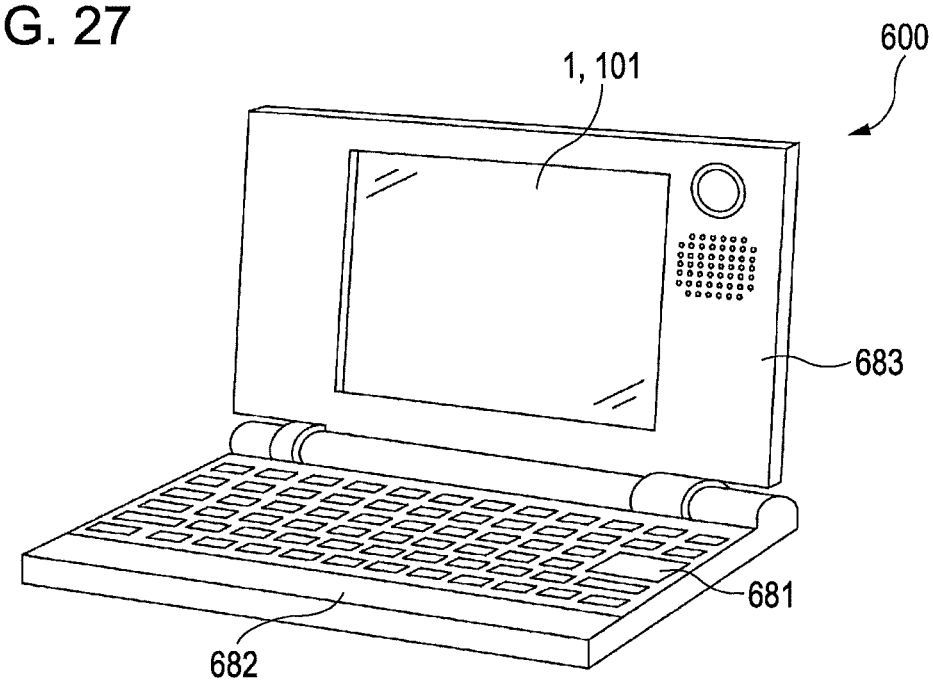
FIG. 27 is a schematic external view of a personal computer.

FIG. 26 is a schematic external view of a cellular phone according to the aspects of the invention. FIG. 27 is a schematic external view of a personal computer.

For example, as shown in FIG. 26, a cellular phone 500 includes a plurality of operation buttons 571, and the liquid crystal device 1 or 101 on an outer frame that has a mouthpiece 572 and an earpiece 573.

Alternatively, as shown in FIG. 27, a personal computer 600 includes a body portion 682 provided with a keyboard 681 and a liquid crystal display unit 683. The liquid crystal display unit 683 has an outer frame that is, for example, provided with the liquid crystal device 1 or 101.

These electronic apparatuses include, in addition to the liquid crystal device 1 or 101, a display information output source, various circuits such as a display information processing circuit, and a display signal generating portion formed of a power supply circuit, or the like, that supplies electric power to those circuits.

Furthermore, in the case of the personal computer 600, a display image is displayed on the liquid crystal device 1 or 101 in such a manner that a display signal generated by the display signal generating portion on the basis of information input from the keyboard 681 or the touch panel.

According to the present embodiment, because the liquid crystal device 1 or 101 that is able to improve connection reliability, on the first face 5A and second face 5B of the substrate 5, between the substrate 5 and both the first flexible circuit board 3A and the second flexible circuit board 3B is provided, it is possible to obtain an electronic apparatus that exhibits high display quality.

Note that the electronic apparatuses further include a projector, a liquid crystal display television, a viewfinder type or a direct view type video tape recorder, a car navigation system, a pager, a personal organizer, an electronic calculator, and the like. Then, of course, the above described liquid crystal device 1 or 101 is applicable as a display portion of these various electronic apparatuses.

In addition, the invention is not limited to the above described embodiments, but it may be appropriately modified into various forms within the technical idea of the invention. Moreover, the above described embodiments may be combined without departing from the scope of the invention.

For example, in the above described embodiments, a thin-film transistor element active matrix liquid crystal device is described as an example of the liquid crystal device, but the liquid crystal device is not limited to it. For example, the liquid crystal device may be a thin-film diode element active matrix or passive matrix liquid crystal device.

In the above described embodiments, the liquid crystal device 1 that is, for example, formed by means of COG (Chip On Glass) is exemplified. However, the aspects of the invention may be applied to the liquid crystal device formed by means of COF (Chip On Film).

In the above described first embodiment, an example in which the first flexible circuit board 3A and the second flexible circuit board 3B are thermally compression bonded to the liquid crystal panel 2 in regions that are deviated from each other in plan view in a direction (Y direction in FIG. 1) parallel to the one side 5b of the substrate 5 is exemplified. In addition, in the second embodiment, an example in which the first flexible circuit board 3C and the second flexible circuit board 3D are thermally compression bonded to the liquid crystal panel 2' in regions that are deviated from each other in plan view in a direction (X direction in FIG. 11) that intersects at a right angle with a direction parallel to the one side 5b of the substrate 5 is exemplified. However, the compression bonded regions are not limited to the above. For example, in the first embodiment, the second flexible circuit board 3B may be thermally compression bonded to a region (a region deviated both in the X direction and in the Y direction in FIG. 1) that is deviated in an oblique direction relative to the first flexible circuit board 3A that is compression bonded to the liquid crystal panel 2.

In the above described first embodiment, an example in which two different first flexible circuit board 3A and second flexible circuit board 3B are compression bonded to the liquid crystal panel 2 is exemplified. However, for example, the first terminals arranged on one circuit board may be connected to the connecting terminal portions 14A, and the second terminals arranged on the same circuit board may be connected to the connecting terminal portions 30A.

In this case as well, it is possible to improve both connection reliability, on the first face 5A side of the substrate 5, between the connecting terminal portions 14A and the first terminals of one circuit board and connection reliability, on the second face 5B side of the substrate 5, between the connecting terminal portions 30A and the second terminals of the one circuit board.

What is claimed is:

1. An electro-optical device comprising:
   a first substrate having a first face, a second face, which is a rear face relative to the first face, and an end face connecting the first face and the second face;
   a display portion that is formed on the first substrate;
   a first terminal that is electrically connected to the display portion and arranged on the first face of the first substrate in a first region of the first face of the first substrate adjoining the end face of the first substrate;
   a first flexible circuit board that is connected to the first terminal through an anisotropic conductive film and arranged on the first face of the first substrate, the first flexible circuit board extending from the end face of the first substrate; and
   a second terminal that is arranged on the second face of the first substrate in a second region of the second face of the first substrate adjoining the end face of the first substrate, wherein the second region does not overlap the first region in plan view, wherein
   one of the first flexible circuit board and a second flexible circuit board is connected to the second terminal in the second region and extends from the end face of the first substrate, and wherein
   a region of the second face of the first substrate, which overlaps the first region in plan view, is formed to be a smooth face.

2. The electro-optical device according to claim 1, wherein the second terminal is arranged in a region of the second face of the first substrate, which does not overlap a region opposite the first flexible circuit board.

3. The electro-optical device according to claim 1, wherein a region of the first face of the first substrate, which overlaps the second region in plan view, is formed to be a smooth face.

4. The electro-optical device according to claim 1, wherein the one of the first flexible circuit board and the second flexible circuit board is connected to the second terminal in the second region through the anisotropic conductive film.

5. The electro-optical device according to claim 1, wherein the second terminal is electrically connected to an electrode that is formed on the second face of the first substrate.

6. An electronic apparatus comprising the electro-optical device according to claim 1.

7. The electro-optical device according to claim 1, further comprising a second substrate arranged on the first face of the first substrate and a light guide plate arranged on the second face of the first substrate, wherein the first substrate and the second substrate seal a liquid crystal, and wherein, in plan view, the first region does not overlap a region of the first face of the first substrate where the second substrate is arranged and the second region does not overlap a region of the second face of the first substrate where the light guide plate is arranged.

* * * * *